United States Patent
Wakabayashi

(10) Patent No.: US 8,250,502 B2
(45) Date of Patent: Aug. 21, 2012

(54) AUTOMATED SYNTHESIS APPARATUS AND METHOD

(75) Inventor: Kazutoshi Wakabayashi, Tokyo (JP)

(73) Assignee: NEC Corporation, Tokyo (JP)

( * ) Notice: Subject to any disclaimer, the term of this patent is extended or adjusted under 35 U.S.C. 154(b) by 1362 days.

(21) Appl. No.: 11/864,623

(22) Filed: Sep. 28, 2007

(65) Prior Publication Data

US 2008/0082805 A1 Apr. 3, 2008

(30) Foreign Application Priority Data

Sep. 29, 2006 (JP) .................................. 2006-268348

(51) Int. Cl.
*G06F 17/50* (2006.01)
(52) U.S. Cl. ........... 716/104; 716/111; 716/136; 703/16
(58) Field of Classification Search .................. 716/104, 716/111, 136; 703/16
See application file for complete search history.

(56) References Cited

U.S. PATENT DOCUMENTS

| 5,701,489 A * | 12/1997 | Bates et al. .................... 717/157 |
| 2008/0034357 A1 * | 2/2008 | Gschwind ..................... 717/149 |

FOREIGN PATENT DOCUMENTS

| JP | 5-334391 A | 12/1993 |
| JP | 5-334466 A | 12/1993 |

OTHER PUBLICATIONS

Kazutoshi Wakabayashi and Hiroshi Tanaka, "Global Scheduling Independent of Control Dependencies based on Condition Vectors," Proc. of 29th ACM/IEEE Design Automation Conference, pp. 112-115, 1992, 6.

* cited by examiner

Primary Examiner — Phallaka Kik
(74) *Attorney, Agent, or Firm* — Sughrue Mion, PLLC

(57) ABSTRACT

Disclosed is an automated synthesis system in which a generalized condition vector (GCV) is generated at a node that is the leaf of a tree indicating a conditional branch of a control/data flow graph representing the flow of behavioral control and data of a circuit. The GVC is a condition vector includes valid bits that are set as a condition vector of code 1 only at one component in a case where an outer conditional operation to a certain operation node is unresolved and, moreover, an inner conditional operation to said certain operation node is resolved, the valid bits being bits at positions where components of a vector of the inner side resolved conditional operation are 1's. The GVC of the operation node is calculated by taking a bitwise logical OR with the condition vector of the unresolved conditional operation. At such time the bits of component 1's of valid bits of the GVC of the inside resolved condition are masked in the bitwise logical OR operation, and parallel IF statements are treated the same as speculative execution of a condition.

60 Claims, 26 Drawing Sheets

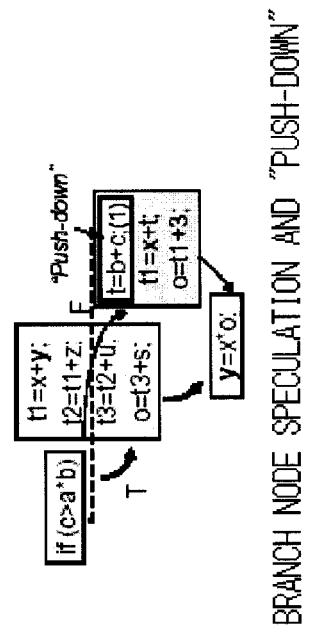
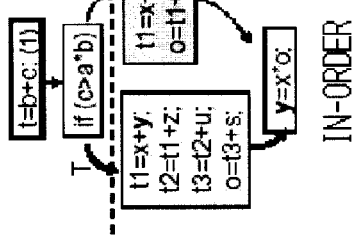
FIG. 1A PRIOR ART
IN-ORDER
FIG. 1B PRIOR ART
BRANCH NODE SPECULATION AND "PUSH-DOWN"
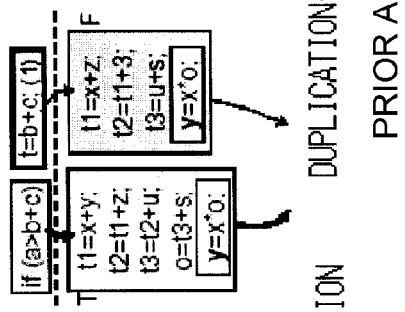
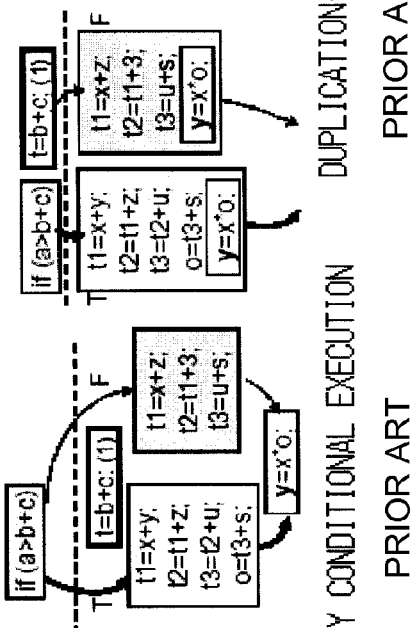
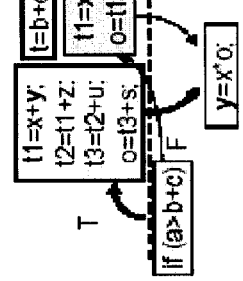
FIG. 1C PRIOR ART
LATE CONDITIONAL EXECUTION
FIG. 1D PRIOR ART
EARLY CONDITIONAL EXECUTION
FIG. 1E PRIOR ART
DUPLICATION-UP

EXAMPLE OF FOUR BRANCHES IN THREE LEVELS

EXAMPLE OF FOUR BRANCHES IN TWO LEVELS

|  | BCV |
|---|---|
| x=a*c; | [1,1] |
| t=b+c; | [1,1] |
| if (a*b<c) | [1,1] |
|   o=x+y+z; | [1,0] |
| else |  |
|   o=x+t; | [0,1] |

BEHAVIORAL DESCRIPTION
AND BCVs

```
x=a*c;
if (a^b<c)
   o=x+y+z;
else {
   t=b+c;
   o=x+t; }
```

EXAMPLE OF IMPLEMENTATION
BY CODE MOTION

CDFG AND EXTENDED CONDITION VECTORS
(ECV) OF FIG. 4A

FIG. 5A PRIOR ART
```
if(a*b<c)        [1,1]
  t=x+y+z+u;    [1,0]
else
  t=x+2;        [0,1]
```
BEHAVIORAL DESCRIPTION
FIG. 5B PRIOR ART
```
s=x+y+z;
if(a*b<c)
  t=s+u;
else
  t=x+2;
```
CODE MOTION
FIG. 5C PRIOR ART
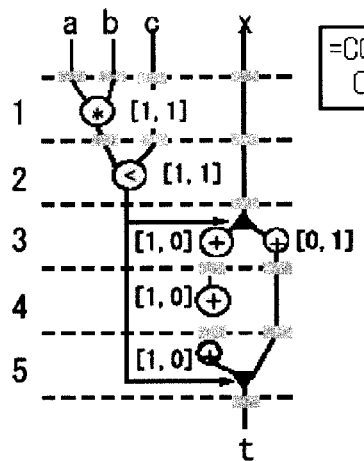
IN-ORDER EXECUTION:
3/5 CYCLES
FIG. 5D PRIOR ART
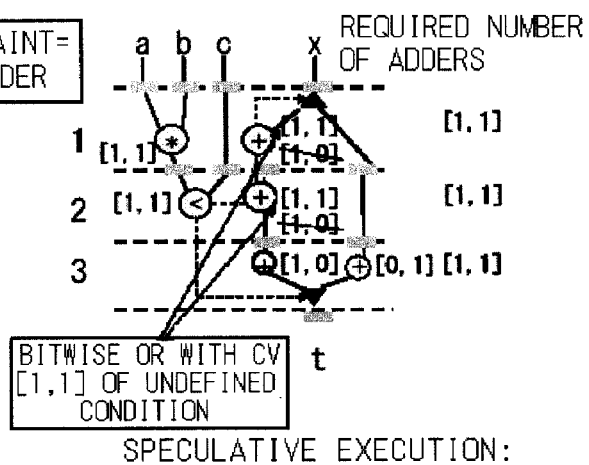
SPECULATIVE EXECUTION:
3/3 CYCLES

FIG. 6A PRIOR ART
|   | BCV | ECV | ACV |
|---|-----|-----|-----|
| 1: t=b+c; | (1,1) | (0,1) | [1,1] |
| 2: if (a*b<c) /*c1*/ | (1,1) | (1,1) | [1,1] |
| 3:   o = x+y+z+s+u; | (1,0) | (1,0) | [1,1] |
| 4: else |  |  |  |
| 5:   o = x+t; | (0,1) | (0,1) | [1,1] |
BEHAVIORAL DESCRIPTION
AND CONDITION VECTORS
FIG. 6B PRIOR ART
1: v=x+y+z;
2: if (a*b<c) /*c1*/
3:   o =v+s+u;
4: else
5:   t=b+c;
6:   o = x+t;
WHEN c1 IS UNDEFINED
SPECULATIVE EXECUTION BY CODE MOTION
FIG. 6C PRIOR ART
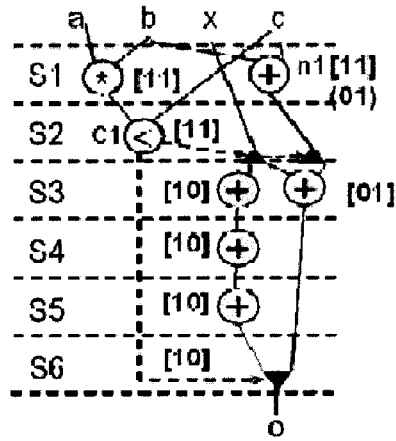
IN-ORDER EXECUTION: 6/3 CYCLES
FIG. 6D PRIOR ART
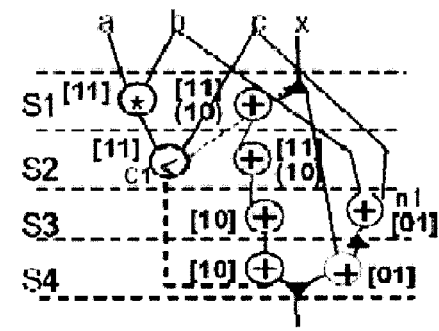
SPECULATIVE EXECUTION AND PUSH-DOWN:
4/4 CYCLES

BEHAVIORAL DESCRIPTION

```
if (c1)     x=a+b-c+d;
else if (c2) x=y+z+u-v;
s=s+b; /*n1*/
```

PATH-LENGTH VECTOR [4,4,1]
WITHOUT NODE DIVISION
(MAXIMUM OF FOUR CYCLES)

PATH-LENGTH VECTOR [3,3,1]
WITH NODE DIVISION
(MAXIMUM OF THREE CYCLES)

FUVall

S1: [1,2,3]
S2: [2,0,0]
S3: [1,0,1]
S4: [1,2,2]

---

PATH-LENGTH VECTOR:[4,2,3]

EXAMPLE OF FUVall WITH RESPECT
TO RESULT OF SCHEDULING

GENERATED STATE TRANSITIONS
OF FSM FOR CONTROL

PRIOR ART

FIG. 11A
|  | CONTROL STEP | 1 | 2 | 3 |
|---|---|---|---|---|
|  | DEFINED CONDITION | ALL | 1)c1 | 2)c2 |
| 1: | t=s+u; /*n1*/ | [010] | [011] | [111] | [1<u>10</u>] |
| 2: | if (a*b<c) /*c1*/ | [111] | [111] | [111] | [111] |
| 3: | o=x+y+z; | [100] | [100] | [111] | [111] |
| 4: | else if (b>c) /*c2*/ | [011] | [011] | [111] | [111] |
| 5: | o=x+t; /*n5*/ | [010] | [011] | [111] | [1<u>10</u>] |
|  | else |  |  |  |  |
| 6: | o=x+u+5; | [001] | [011] | [111] | [1<u>01</u>] |
ACV     GCV
1) BEHAVIORAL DESCRIPTION AND GCVs, ACVs    2) IN-ORDER    3) DECIDE INSIDE FIRST
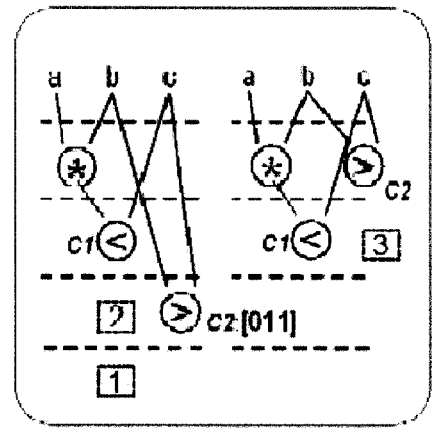
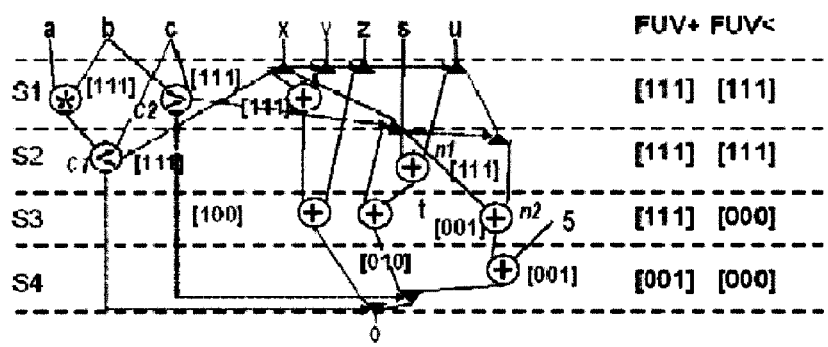
SCHEDULING UTILIZING ACV (MAXIMUM OF FOUR CYCLES)
FIG. 11B
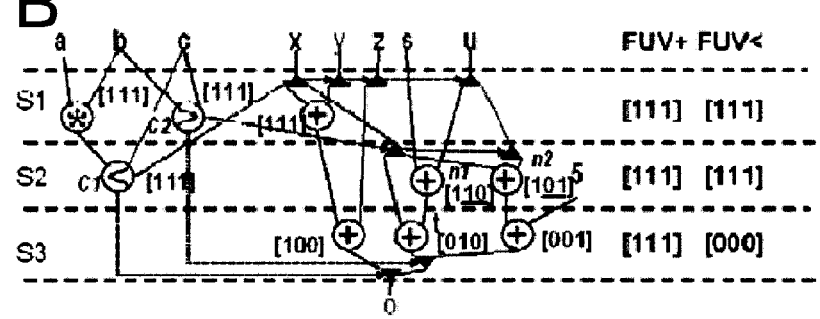
SCHEDULING UTILIZING GCV (MAXIMUM OF THREE CYCLES)

FIG. 12

| a:not | b:done | c:not | d:done | UNRESOLVED CONDITIONS | | IN CASE OF ( ) NUMBER OF ADDI-TIONS IN EACH BRANCH |
|---|---|---|---|---|---|---|
| [1111 11] | [1111 11] | [1110 11] | [1110 11] | NONE | a,c | |
| (1111 11) | (1111 00) | (1110 00) | (1100 00) | ECV | GCV | FUV+ |
| if (a) if (b) if (c) if (d) -(1) | | | | (1000 00) | [10 10 11] | [1,0,1,0,1,1] |
| else -(2) | | | | (0100 00) | [01 10 11] | [0,2,2,2,2,2] |
| GUARD CONDITION else -(3) | | | | (0010 00) | [11 10 11] | [3,3,3,0,3,3] |
| else -(4) | | | | (0001 00) | [00 01 11] | [0,0,0,4,4,4] |
| else if (e) -(5) | | | | (0000 10) | [1111 10] | [5,5,5,5,5,0] |
| else -(6) | | | | (0000 01) | [1111 01] | [6,6,6,6,0,6] |
| e:done ECV:(0000 11) GCV:[1111 11] | | | | TOTAL :FUV+ | | [10,11,9,10,10,11] |

FIG. 13

| CONDITION | ALL RESOLVED | ALL UNRESOLVED | UNRESOLVED CONDITIONAL OPERATIONS ||||||
|---|---|---|---|---|---|---|---|---|
| | | | a | b | d | b,c | a,b | a,c,d,e |
| a (1 1 1 1 1 1) | done | not | not | done | done | done | not | not |
| b (1 1 1 1 0 0) | done | not | guard | not | done | not | not | guard |
| c (1 1 1 0 0 0) | done | not | guard | guard | done | not | guard | not |
| d (1 1 0 0 0 0) | done | not | guard | guard | not | guard | done | not |
| e (0 0 0 0 1 1) | done | not | guard | done | done | done | guard | not |
| (1) | [100000] | [111111] | [100011] | [100100] | [110000] | [101100] | [100111] | [111011] |
| (2) | [010000] | [111111] | [010011] | [010100] | [110000] | [011100] | [010111] | [111011] |
| (3) | [001000] | [111111] | [001011] | [001100] | [001000] | [111100] | [001111] | [111011] |
| (4) | [000100] | [111111] | [000100] | [111100] | [000100] | [111100] | [111111] | [000111] |
| (5) | [000010] | [111111] | [111110] | [000010] | [000010] | [000010] | [111110] | [111111] |
| (6) | [000001] | [111111] | [111101] | [000001] | [000001] | [000001] | [111101] | [111111] |

NO PARALLEL IFs;
ALL BRANCHES
EXCLUSIVE if (a) ... [1,0,0]
else if (b) ... [0,1,0]
else ... [0,0,1]

PARALLEL IFs INSIDE NEST if (a) ... [1,0,0]
else if (b) ... [0,1,0]  CANNOT BE
else ... [0,0,1]  EXPRESSED
if (c) ... ???  WITH ACV
else .... ???

COPY OF BRANCH ⇒

CVs AFTER COPYING (CODE MOTION)
OF IF STATEMENTS
(ALL LEAVES BECOME EXCLUSIVE)

DRAWBACKS:
1) CODE MOTION OCCURS
2) NUMBER OF BRANCHES
   INCREASES (AMOUNT OF
   COMPUTATION INCREASES)

FIG. 15A

PARALLEL IFs INSIDE NEST

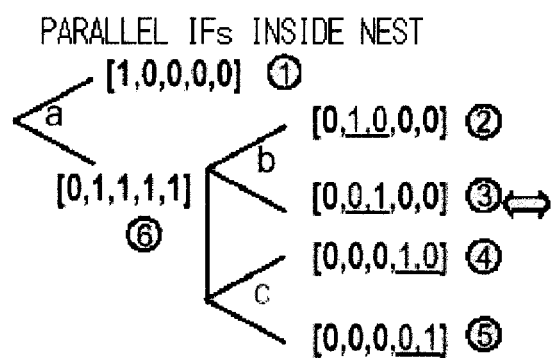

UNDERLINED PORTIONS ARE VALID BITS

FIG. 15B

```
if (a) ...     [1,0,0,0,0]
else if (b) ... [0,1,0,0,0]
    else ..    [0,0,1,0,0]
    if (c) ... [0,0,0,1,0]
    else ....  [0,0,0,0,1]
```

FIG. 15C

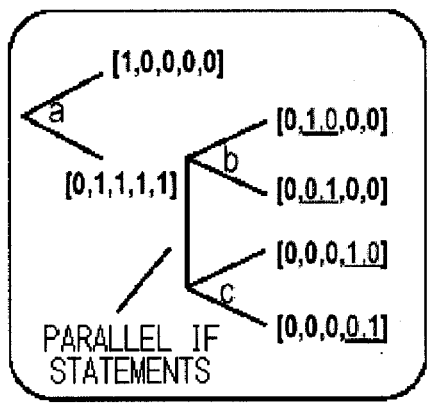

PARALLEL IF STATEMENTS

FIG. 15D

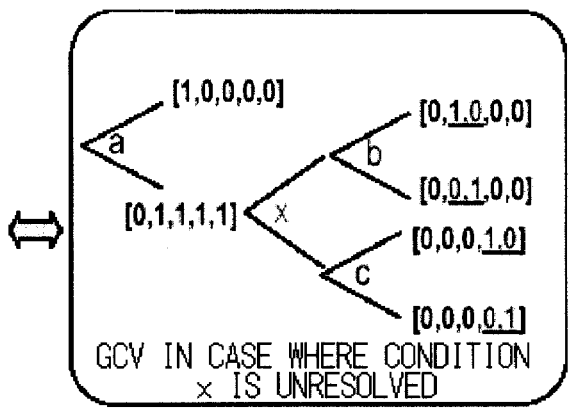

GCV IN CASE WHERE CONDITION x IS UNRESOLVED

IN THE FIGURE ON THE RIGHT, MUTUAL EXCLUSIVENESS BETWEEN CONDITIONAL BRANCHES B AND C VANISHES IN A CASE WHERE X IS UNRESOLVED. ACCORDINGLY, THE SAME CONTROL STRUCTURE IS INDICATED (CONDITIONAL MUTUAL EXCLUSIVENESS CONDITION).

⇨ UNIFIED EXPRESSION BOTH OF PARALLEL IF STATEMENTS AND SPECULATIVE EXECUTION OF CONDITIONS THEMSELVES IS POSSIBLE

FIG. 16A

|  |  |  |
|---|---|---|
| if (a) | if (b) | [1011110] |
|  | else | [0111110] |
|  | if (c) | [1110110] |
|  | else | [1101110] |
|  | if (d) | [1111100] |
|  | else | [1111010] |
| else |  | [0000001] |

PARALLEL CONDITIONAL STATEMENTS AND GCVs

FIG. 16B

|  |  |  |  | |
|---|---|---|---|---|
| if (a) | if (b) | if (c) | if (d) | [100000000] |
|  |  |  | else | [010000000] |
|  |  | else | if (d) | [001000000] |
|  |  |  | else | [000100000] |
|  | else | if (c) | if (d) | [000010000] |
|  |  |  | else | [000001000] |
|  |  | else | if (d) | [000000100] |
|  |  |  | else | [000000010] |
| else |  |  |  | [00000001] |

TREE COPY AND BCVs

FIG. 16C

|  |  |  |
|---|---|---|
| if (a) | if (b) | [100] |
|  | else | [010] |
| else |  | [001] |
| if (a) | if (c) | [100] |
|  | else | [010] |
| else |  | [001] |
| if (a) | if(d) | [100] |
|  | else | [010] |
| else |  | [001] |

TREE DIVISION

FIG. 17A

| | | |
|---|---|---|
| if (a) | if (c) | [<u>10</u>110] |
| | else | [<u>01</u>110] |
| | if (d) | [11<u>10</u>0] |
| | else | [11<u>01</u>0] |
| else | | [00001] |

FIG. 17B

| | | | |
|---|---|---|---|
| if (a) | if (<u>b</u>) | if (c) | [<u>10</u>110] |
| | | else | [<u>01</u>110] |
| | else | if (d) | [11<u>10</u>0] |
| | | else | [11<u>01</u>0] |
| else | | | [00001] |

```
a;
If (c1) {
    b;
    if (c2) c;
    else    d;
    If (c3) e;
    else    f;
            if (c4) g;
            else  h;
            If (c5) i;
            else   j;
} else k;
```

BEHAVIORAL DESCRIPTION

CORRESPONDING GCVs

else         [0,1,0, 1,1]

else                 [0,0,1, 1,1]

T2: if (c )                  [1,1,1, 1,0]

else                 [1,1,1, 0,1]

BEHAVIORAL DESCRIPTION

WITHOUT PARALLELIZATION
MAXIMUM OF FOUR STEPS
IN-ORDER EXECUTION

WITH PARALLELIZATION
MAXIMUM OF TWO STEPS

PARALLELIZATION OF
CONDITIONAL BRANCHES

FIG. 21A

|  |  |  | GCV |
|---|---|---|---|
| CT1: if (c1) x = a + b; | -(1) | [1,0] | [1,0,1,1,1] |
| else    x = a + b - c; | -(2) | [0,1] | [0,1,1,1,1] |
| z = a - b; | -(3) | [1] | [1,1,1,1,1] |
| CT2: if (c2) y = a + c + x; | -(4) | [1,0,0] | [1,1,1,0,0] |
| else { y = a + c; | -(5) | [0,1,1] | [1,1,0,1,1] |

EXAMPLE OF BEHAVIORAL DESCRIPTION OF TOP-LEVEL PARALLEL (SEQUENTIAL) IF STATEMENTS

FIG. 21B

| | FIRST IF STATEMENT (CT1) | | | | | | SECOND IF STATEMENT (CT2) | | | | | (GCV) |
|---|---|---|---|---|---|---|---|---|---|---|---|---|
| | R0 | | | FUV+ FUV- | FUVall | R1 | | | FUV+ FUV- | FUVall | R2 | FUV+ FUV- |
| | + | - | c1   a   b | | | + | - | c2   a   c   c3 | | | + | - |
| S1 | 2 | 1 | ⊕ ⊕ ⊖ [1,0] [0,1] [1,1] | [1,1] [1,1] | [2,2] | 1 | 0 | ⊕ ⊕ [1,0,0] [0,1,1] | [1,1,1] [0,0,0] | [1,1,1] | 0 | 0 | [22 222] [11 000] |
| S2 | 2 | 1 | ⊖ [0,1] | [0,0] [0,1] | [0,1] | 2 | 0 | | [0,0,0] [0,0,0] | [0,0,0] | 2 | 0 | [00 000] [01 000] |
| S3 | 2 | 1 | | [0,0] [0,0] | [0,0] | 2 | 1 | ⊕   ⊖ [1,0,0] [0,1,0] | [1,0,0] [0,1,0] | [1,1,0] | 1 | 0 | [00 100] [00 010] |
| S4 | 2 | 1 | x   z | [0,0] [0,0] | [0,0] | 2 | 1 | ⊕ [0,1,0] | [0,1,0] | [0,1,0] | 1 | 1 | [00 010] [00 000] |

PARALLELIZATION OF TOP-LEVEL PARALLEL IFSTATEMENTS

FIG. 22A
FIG. 22B
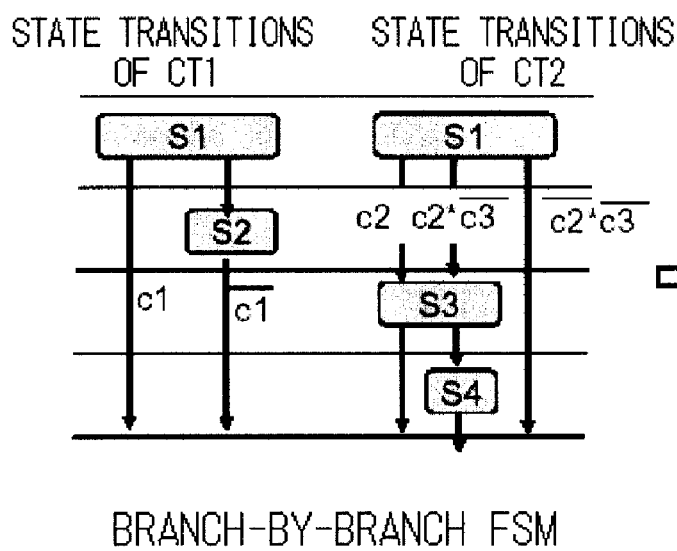
BRANCH-BY-BRANCH FSM
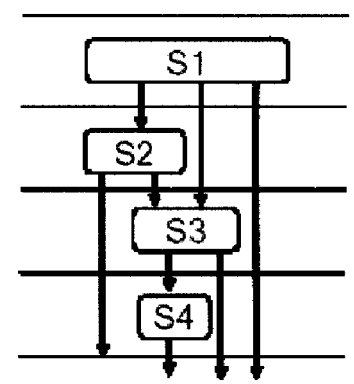
OVERALL FSM

FIG. 24

SCHEDULING OF IN-BRANCH PARALLEL CONDITIONAL BRANCHES BY GCV

| DESIGN | | PREDICTION AFTER BEHAVIORAL SYNTHESIS | | | ACTUAL MEASUREMENT AFTER LOGICAL SYNTHESIS | |
|---|---|---|---|---|---|---|
| | | NUMBER OF STATES | AREA | DELAY | AREA | DELAY |
| ENCODER | THIS INVENTION | 7 | 13.8K | 5.7 | 13.0K | 6.5 |
| | COMPARATIVE EXAMPLE | 8 | 12.9K | 5.6 | 12.1K | 6.4 |
| FILTER | THIS INVENTION | 7 | 18.4K | 4.5 | 17.1K | 6.2 |
| | COMPARATIVE EXAMPLE | 10 | 42.1K | 5.7 | 38.2K | 7.2 |
| CODEC | THIS INVENTION | 20 | 102.9K | 9.4 | 102.9K | 9.7 |
| | COMPARATIVE EXAMPLE | 27 | 103.4K | 10.2 | 103.4K | 11.5 |

FIG. 25

RESULTS IN LOOP PIPELINE

|  | SYNTHESIS OF LOOP | | PIPELINING OF LOOP | |
|---|---|---|---|---|
|  | NUMBER OF STATES | NUMBER OF CYCLES | MINIMUM II* | NUMBER OF CYCLES |
| THIS INVENTION | 5 | 500 (30% REDUCTION) | 2 | 203 (50% REDUCTION) |
| COMPARATIVE EXAMPLE | 7 | 700 | 4 | 403 |

AUTOMATED SYNTHESIS APPARATUS AND METHOD

RELATED APPLICATION

This application is based upon and claims the benefit of the priority of Japanese patent application No. 2006-268348, filed on Sep. 29, 2006, the disclosure of which is incorporated herein in its entirety by reference thereto.

FIELD OF THE INVENTION

This invention relates to an automated synthesis apparatus and method for application to semiconductor integrated circuits. More particularly, the invention relates to an apparatus and method, and compiler technology, for optimizing mutual exclusiveness and speculative execution of a variety of types using a control/data flow graph representing the flow of control and data of circuit operation.

BACKGROUND OF THE INVENTION

An overview of the technology relating to the present invention will be stated first. In order to decide the order of execution of operations and perform scheduling for deciding the execution steps from a control/data flow graph (CDFG), which represents the flow of control and data of a circuit that includes conditional branches in behavioral synthesis, it is necessary to analyze the mutual exclusiveness of execution of operations in the control/data flow graph and determine whether identical arithmetic units can be shared. Such mutual exclusiveness is able to be determined whether a target operation belongs to a different branch by directly examining the control/data flow graph.

<Speculative Execution of Single Conditional Branch>

Speculative execution of a single conditional branch will be described. Speculative execution in scheduling means scheduling operations in a branch and operations in a conditional clause in control steps that precede a determination as to whether a condition is true or false.

In a case where code motion is carried out, instruction codes inside a condition are actually moved outside of the conditional clause.

The types of speculative execution will be described first. Speculative execution is divided broadly into the following types:

speculative execution with respect to a single conditional branch statement; and speculative execution among multiple conditional branch statements (parallelization of conditional branch statements).

FIGS. 1A-1E illustrate several typical examples of speculative execution with respect to a single conditional branch. In FIGS. 1A-1E, the rectangles indicate basic blocks, and characters T and F represent true (T) and false (F) branches, respectively, of a conditional branch. The solid-line arrows between the basic blocks indicate control dependency between the basic blocks.

In FIG. 1A illustrates a case where operations are executed "in order", i.e., in the order set forth in the behavioral description.

$t=b+c;$                        (1)

if $(c>a*b)$ $\{t1=x+y;$ $t2=t1+z;$ $t3=t2+u;$ $o=t3+s;\}$ else $\{t1=x+t;$ $o=t1+3;\}$ $y=x*c;$ Examples in which this is speculatively executed are as shown in FIG. 1B to FIG. 1E. It should be noted that in FIG. 1B to FIG. 1E, all of the images shown are those obtained after code motion.

"Branch node speculation and push-down" in FIG. 1B is an example ("Push-down") in which two operations ($t1=x+y$ and $t2=t1+z$) of the Then clause of a conditional statement have been speculatively executed and an operation [$t=b+c$; (1) in FIG. 1] that precedes the conditional statement [if $(c>a*b)$] has been moved to the side of the ELSE clause. This utilizes the fact that the variable t is referred to solely by the ELSE clause. By scheduling the addition operation (b+c) at (1) to a cycle later than the IF clause, it is caused to be executed solely by the ELSE clause. Meaning is not changed by this code motion. In this case, code correction referred to as "bookkeeping" is unnecessary.

"Late conditional execution" in FIG. 1C is speculative execution in which the THEN clause ($\{t1=x+y; t2=t1+z; t3=t2+u; o=t1+3;\}$ and the ELSE clause $\{t1=x+t; o=t1+3\}$ are both executed in the cycle preceding the operation of the conditional clause. This is a useful conversion in a case where there are plentiful arithmetic units and execution of the conditional clause is not performed in an earlier cycle.

"Early conditional execution" in FIG. 1D corresponds to a case that is the opposite of FIG. 1C. Here the conditional operation is executed in a cycle that precedes the operation [the statement $t=b+c$; (1) in FIG. 1] of the statement preceding the conditional branch statement. That is, the conditional operation is executed as early as possible. Although $t=b+c$; (1) is executed by either the THEN clauses or the ELSE clause, it is copied to the THEN clause and ELSE clause in a case where code motion is performed, and thus is moved to both of these clauses. In the case of a processor having condition-flagged instructions, etc., the results of conditional branches may be retained and operations inside a conditional may execute the condition-flagged instructions.

"Duplication-up" in FIG. 1E is speculative execution in which the operational instruction ($y=x*c;$) of the statement that succeeds the conditional statement is moved by being copied into the respective conditional clauses of THEN and ELSE.

Depending on how FIGS. 1D and 1E are utilized, it is possible to reduce the number of execution cycles with the same number of arithmetic units.

Although an example of an IF statement (two branches) is illustrated in FIGS. 1A-1E, similar speculative execution is conceivable also with multiple branch instructions such as a switch statement in the C language.

As illustrated above, a variety of types of speculative execution are conceivable with respect a single conditional branch. In this specification, speculative execution with respect to a single conditional branch is referred to as "local" speculative execution.

It should be noted that with scheduling according to the present invention, speculative executions including ones later described all be implemented efficiently, as will be set forth below.

<CDFG>

A control/data flow graph (CDFG) will be described next. A CDFG represents control and data dependencies simultaneously. FIG. 2 illustrates one example of this. A CDFG utilized by a behavioral synthesis will be described below. CDFGs have a format in which the interior of a basic block is held by the DFG and the control relationship between basic blocks is held by the CFG (Control Flow Graph) (a directed graph having basic blocks as nodes) (see FIG. 1A-1E).

However, with the CDFG representation format, the control-dependency relationship between basic blocks is mainly expressed and data lines between basic blocks are not directly connected. In order to perform global scheduling, it is necessary to move several operators (apply code motion) between basic blocks, and it is difficult to find motion that is effective as a whole.

For this reason, a method (trace scheduling) of creating specific paths (traces) separately has been adopted. With this method, however, all traces cannot be optimized. The CDFG described below is data representation that overcomes the above problems and readily takes global scheduling into consideration.

With the CDFG, the control structure of a conditional branch is given for every data line.

In FIG. 2,

Δ (referred to as a "fork node" represents data FORK, and ∇ (referred to as a "join node") represents data JOIN.

Here JOIN is considered. That is, the values of variables a, b, and c are forked (FORK) at the value of the conditional operation (a>b) and are selected (JOIN) by the result of the conditional operation (a>b) after both branches are computed.

The lines from "a>b", which is a conditional operation, to the FORK nodes and JOIN node are referred to as "condition lines". The lines indicating flow of data are referred to as "data lines".

With the conventional method, basic blocks are expressed explicitly. With a CDFG, however, it is noteworthy that basic blocks are not expressed explicitly but that data dependency relationship among a plurality of basic blocks is expressed directly.

A plurality of basic blocks can be represented as a single CDFG without grouping being performed on a block-by-block basis. This CDFG is suited for performing global scheduling.

In a case ("in-order") where a conditional is resolved before an operation inside a conditional branch, an ordinary branch operation is carried out. When the conditional is executed late ["late conditional execution" at FIG. 1C], FORK and JOIN operations are actually performed (both are executed and the value is selected last).

The CDFG is capable of representing these various speculative executions with the form of the speculative execution of a single conditional branch statement being kept as is (i.e., without code motion). (In actuality, it is possible for a "condition vector", described below, to be appended to each operation node.)

<Condition Vector>

A condition vector is vector representation introduced in order to detect mutual exclusiveness of operations that are based upon a conditional branch. By attaching a condition vector to the operation node of a CDFG, all speculative executions can be represented in a unified manner and scheduling for the purpose of optimizing all paths can be carried out efficiently. In other words, as mentioned above, a scheduler can handle operations inside multiple conditional branches in the manner of operations inside a single basic block without being aware of the basic block.

First, a condition vector will be described and then scheduling that is based upon a condition vector will be described.

<Basic Condition Vector>

A condition vector represents, in the form of a vector, the execution conditions of a conditional branch (an IF statement or SWITCH statement in C language). This will be described with reference to FIGS. 3A-3D. The behavioral description on the left side in FIG. 3A indicates three levels of nested IF statements by pseudo-C code (see Patent Documents 1 and 2, etc.).

In FIG. 3A, "a;", "b;", etc., designate "statements" in the C language, and "c1", "c2", etc., signify operations in a conditional. In FIG. 3C, the control structure of the IF statements of this behavioral description is represented by binary trees.

A condition vector (CV) is attached as follows: First, a one-hot encoded vector (a vector of a code in which only one component is "1") is created at a node where the "leaf" of a "tree" indicates the conditional branch on the right.

In the example in FIG. 3C, there are three levels of four branches, c, e, f and g are leaf nodes and the following vectors are applied to the respective nodes, by way of example:

c: [1,0,0,0]
e: [0,1,0,0]
f: [0,0,1,0]
g: [0,0,0,0]

Each vector has only one "1" component, and the vectors are mutually perpendicular (the inner product of any two vectors is equal to zero; the vectors are linearly independent).

The values of a bitwise logical sum (OR) between the vectors of child nodes are applied to the node of the respective parent. For example, the condition vector of node d is calculated by the bitwise logical ORed value between the vector [0,1,0,0] of e, which is the child node of d, and the vector [0,0,1,0] of node f, which is the child node of d, and therefore the condition vector of node d is as follows:

d: [0,1,1,0]

Furthermore, since the condition vector of node b is calculated by the bitwise logical ORed value between the vector [1,0,0,0] of c and the vector [0,1,1,0] of d, then the condition vector of node b is as follows:

b: [1,1,1,0]

Node a is the result of all the bitwise logical ORs and is [1,1,1,1].

The condition vector of conditional c1 is the same as that of a, namely [1,1,1,1], and the condition vector of conditional c2 is the same as that of b, namely [1,1,1,0].

Illustrated in FIG. 3B are two-level nested IF statements (four branches) and the corresponding basic condition vectors. Although FIGS. 3A and 3B have different conditional branch structures, the number of leaf nodes are equal. The numbers of dimensions therefore are the same and the condition vectors of the leaf nodes are similarly assigned one-hot codes. Nodes other than leaf nodes also are obtained by taking the bitwise logical OR between child BCVs (Basic Condition Vectors).

The number of dimensions of a vector is equal to the number of leaves. In a case where IF statements are nested, therefore, we have the following:

number of dimensions of vector="number of conditionals of IF statements+1".

When there is a SWITCH statement, it is defined in a similar manner. Whereas an IF statement is two-branch structure, there are multiple branches with a SWITCH statement. Since the number of branches in the case of SWITCH only is the number of leaves, this is equal to the "number of CASE clauses of the SWITCH statement". If, in a case where IF statements overlap in a SWITCH statement, a plurality of SWITCH statements overlap, then the number of dimensions is reduced by one for each overlap. What is noteworthy is that this becomes a number of linear dimensions, namely number of IF statements+1, without becoming exponent of the number of the IF statements.

The components of a condition vector are the binary values "0" and "1" and are expressed usually by 32 dimensions of int (integer type) 32 bits (or 64 bits), and a bitwise logical OR operation necessary for computation also can be implemented at high speed (in one cycle). In the implementation of a program, a tree structure composed of IF statements and SWITCH statements is depth-first searched (or tree walked) and the number of leaves is counted. Further, one-hot encoding in which "1" is appended is performed in the order of depth-first search starting higher bits. More specifically, [1,0,0 . . . ], [0,1,0 . . . ] are allocated in order starting from leaves that arrive at the top of the behavioral description.

<BCV>

A condition vector thus defined in terms of the behavioral description is referred to as a "basic condition vector". A basic condition vector is defined as follows with respect to one nested conditional branch:

<Definition of Basic Condition Vector (BCV)>
number of dimensions=number of leaves;
BCV(n)=one-hot encoding (in case of an operation in which operation n is at a leaf);
=BCV(s) or BCV(t) or BCV(u) or BCV(v) (in a case where n is other than a leaf);
where
operations s, t, u, v are operations that follow n (along depth direction of the branch), and
or denotes a bitwise logical OR.

One component of a condition vector is such that the execution condition of an operation is indicated by the OR of leaf conditions. Accordingly, in a case where the same components in relation to condition vectors of two operation nodes do not have a 1 in common, operations are executed only mutually exclusively (if one operation node is executed, then the other is not). Such mutual exclusiveness is referred to as "conditional mutual exclusiveness".

On the other hand, mutual exclusiveness in a case where an operation is executed in a different cycle is referred to as "temporal mutual exclusiveness".

Conditional mutual exclusive operations are executed simultaneously in a manner similar to the case of temporal mutual exclusiveness, and therefore it is possible to share the same arithmetic unit.

When a condition vector is utilized, the exclusiveness of two operations can be discriminated immediately owing to the fact that the bitwise logical AND of the condition vectors is "0" (operations can be executed by a single clock instruction of the CPU).

Conditional mutual exclusiveness based upon a branch instruction includes conditional mutual exclusiveness based upon data dependency besides that described explicitly in a behavioral description to the effect that the operations are in respectively different branches. This is implicit mutual exclusiveness that does not appear explicitly in terms of the behavioral description. This is referred to as "data-dependent conditional mutual exclusiveness" or "implicit conditional mutual exclusiveness".

The mutual exclusiveness based upon data dependence is conditional mutual exclusiveness that appears between operations in a branch, when the result of the operations is not used in the branch. For example, in the behavioral description at FIG. 4A, the result of "t=b+c;" is not used in the THEN clause of the succeeding IF statement and is used only by the ELSE clause (o=x+t;). In other words, the value of the variable t is utilized only in a case where the result of the conditional "(a*b<c)" is false; the value of variable t is not utilized in a case where the result of the conditional is true.

With regard to this implicit mutual exclusiveness, conditional mutual exclusiveness can be output explicitly without changing the meaning of the behavior by code-moving "t=b+c" into the ELSE clause, as in the example of implementation based upon code motion in FIG. 4B. However, code motion is not necessarily advantageous in raising speed and is disadvantageous in a case where it is more advantageous to execute "t=b+c" before the conditional.

From a global view, whether code motion is to be performed or not is comparatively difficult to select so as to be actually advantageous for scheduling.

<ECV>

Data-dependent mutual exclusiveness is analyzed by applying condition vectors in a CDFG. A condition vector defined in a CDFG is referred to as an "Extended Condition Vector".

How an ECV is applied will be described with reference to FIG. 4C. First, a basic condition vector (BCV) is applied to the input of a JOIN node, and the BCV is applied as the ECV of the operation node directly connected to the JOIN node (this BCV is a value the same as that of the BCV possessed by the operation node itself).

The ECVs of other operation nodes can be found by the bitwise logical ORs of ECVs of the succeeding operations of the data flow.

A BCV obtained in the behavioral description is decided by the position at which an operation is described (e.g., the position in a tree structure). By contrast, with an ECV, a logical OR is taken along the data line of a CDFG, and therefore implicit conditional mutual exclusiveness that takes data dependency into account can be detected.

In FIG. 4A, the BCV of "t=b+c" mentioned earlier is [1,1]. The ECV, however, is [0,1], as indicated at FIG. 4C. The [0,1] of the ECV is merely the ELSE clause and indicates that the result "t" of this operation ("t=b+c") is being used.

Here the addition operation "t=b+c" cannot actually share an arithmetic unit with the addition operation of the THEN clause immediately.

The reason for this is that it is necessary to compute and store the value of t before it is resolved whether the result of the conditional is true or false. That is, in order to share an arithmetic unit based upon data-dependent mutual exclusiveness, it is necessary that the condition clause ("a*b<c") be executed (scheduled) before "t=b+c".

This relationship indicates that conditional mutual exclusiveness changes dynamically depending upon whether the reverted condition clause has been resolved or not.

An extended condition vector ECV(n) of a certain operation node n is defined as set forth below.

ECV(n)=[1] in a case where n is a node immediately preceding the terminal node;

ECV(n)=BCV(n) in a case where n is a node immediately preceding a JOIN node or is a conditional operation; and ECV(n)=ECV(k) or EVC(l) or ... or ECV(m) in a case other than the two cases mentioned above;
(where k, l and m are successor nodes to the node n, and [1] and [0] indicate vectors in which all of the respective components are 1, 0).

<ACV>

Dynamic mutual exclusiveness is mutual exclusiveness decided dynamically depending upon whether the true/false decision regarding a conditional clause in a conditional branch has been completed or not. More specifically, each type of speculative execution possesses this dynamic mutual exclusiveness, and what expresses this dynamic mutual exclusiveness is an Active Condition Vector.

A case where a behavioral description in FIG. 5A is speculatively executed will be considered. In a case where only the two additions in "x+y+z" of the THEN clause are speculatively executed before the conditional clause, the result is FIG. 5B if code motion is performed. Whether or not such code motion is effective changes depending upon the number of arithmetic units which can be used. This means that performing code motion uniformly is not advisable.

On the other hand, such speculative execution can be implemented utilizing an active condition vector (ACV).

In FIG. 5C illustrates an example in which scheduling is performed "in order" with the constraint that the number of adders is one. In FIG. 5D illustrates result of scheduling that takes speculative execution into consideration with the constraint that the number of adders is one.

In view of FIGS. 5C and 5D, the maximum number of cycles can be reduced from "5" to "3" while the number of adders is kept the same.

In-order execution is such that after the conditional clause "(a*b<c)" ends, the THEN clause or ELSE clause is executed in line with the result of the condition test. The execution cycles necessary for each are five cycles or three cycles.

In a case where the conditional clause has been resolved, the active condition vector ACV has the same value as that of the extended condition vector ECV.

In a case where speculative execution is carried out, the active condition vector ACV changes dynamically in dependence upon whether speculative execution has been executed or not, as illustrated in FIG. 5D.

This indicates that the active condition vector ACV expresses that the execution condition actually changes in a case where speculative execution has been performed.

In FIG. 5D, the initial addition "x+y" and the second addition "+z" of the THEN clause in FIG. 5A has been scheduled speculatively into the first cycle (a cycle into which an operation is scheduled is referred to as a "control step") or into the second cycle.

In the operation ("a*b<c") of the conditional clause, "*" and "<" have been scheduled in the first control step and the second control step, respectively and the true/false of the conditional operation has not been resolved.

In this case, whether the THEN clause or the ELSE clause is to be executed in unclear. In FIG. 5D, therefore, the two addition operations of the THEN clause must always be executed regardless of the result of the condition. In other words, the operation is that of FIG. 5B, which is an example in which code motion has been implemented.

That is, if a certain operation is scheduled by speculative execution in a control step for which a condition has not been resolved, then the conditional mutual exclusiveness of the THEN clause and ELSE clause vanishes in this control step.

In FIG. 5D, the condition vector of the addition node (+) of control step 2 is [1,1] as a result of taking the bitwise logical OR between [1,0] and the condition vector [1,1] of the indeterminate condition [(a*b<c)].

What expresses mutual exclusiveness converted in accordance with whether a conditional is resolved or unresolved is the active condition vector ACV.

The active condition vector ACV of an operation node is calculated by the bitwise logical Ored value between its extended condition vector ECV and ECV of an unresolved conditional operation of the conditional clause to which the operation reverts. In FIG. 5D, the ECVs of the two additions (the two additions in s=x+y+z) which speculatively are executed in control steps 1 and 2 are both [1,0]. However, since the OR is taken with the ECV [1,1] of the operation ">" of the unresolved condition of the conditional clause to which the operation reverts, the ACVs of the two additions are both [1,1].

The meaning of this is that the two additions (the two additions in s=x+y+z) are originally contained in the THEN clause and therefore this ACV is [1,0]. However, if the additions are speculatively executed and scheduled to control steps for which conditions have not been resolved, then the operations should have been executed under the conditions of the both the THEN clause and ELSE clause. Therefore the ACV may be considered to have been a vector [1,1].

That is, the active condition vector ACV of an operation node can be computed by a simple (executable by a single cycle instruction of the CPU) operation, namely bitwise logical OR operation of the ECV of the node and the ECV of an unresolved conditional operation reverting to the node, and conditional mutual exclusiveness at the time of a speculative execution can be expressed correctly.

At this time it is important that expression be performed with no change in the configuration or topology (connection relationship) of the CDFG and only with a change in the value of the condition vector attached to the operation node.

Since the ACV is just calculated one time when an operation node is scheduled, it is not necessary to re-perform computation again and again. In other words, the amount of computation involving the ACV is very small [proportional to the number of conditionals (usually on the order of two to seven)].

In FIGS. 5A-5D, scheduling is carried out under an arithmetic-unit constraint that the number of utilizable adders is one. In FIG. 5C, however, an adder having the [1,0] vector and an adder having the [0,1] vector are utilized mutually exclusively in step 3 (mutually exclusively because the same components do not have a 1 in common).

In FIG. 5D, [1,0] and [0,1] share a single adder in step 3. In steps 1 and 2, on the other hand, addition is always executed and therefore the arithmetic unit cannot be shared.

Another feature of the ACV is that the necessary number of arithmetic units can be computed upon taking into consideration these dynamically changing possibilities of sharing of the resources. This will be described later.

<Definition of Active Condition Vector ACV(n) with Respect to Operation Node n>:

ACV(n)=ECV(n) or ECV(Ci) or ECV(Cj) or ... or ECV(Ck)

where $C_i$, $C_j$, ... and $C_k$ indicate the final node (an operation that decides the true/false of a condition) of a conditional clause of a conditional branch statement to which a node n belongs, and is unresolved (not yet scheduled) in the control step, the ACV of which is to be obtained.

Illustrated in FIG. 6A are basic condition vectors BCV, extended condition vectors ECV and active condition vectors ACV with respect to the following behavioral description:

```
t=b+c;                          1:

if (a*b<c)/*c1*/                2:

o=x+y+z+s+u;                    3:

else                            4:

o=x+t;                          5:
```

Here ACV indicates the value when the condition "c1" is unresolved.

The BCV of the addition ("t=b+c", referred to as "addition 1") on the first line is (1,1), and the ECV thereof is (0,1), indicating that there is data-dependent mutual exclusiveness.

With respect to this behavioral description, FIG. 6B illustrates an example in which speculative execution of the two additions of the THEN clause (the two addition operations that constitute v=x+y+z) and push-down of addition 1 (t=b+c) to the ELSE clause have been performed by code motion. It can be said that it is difficult to perform such code motion with the aim of achieving overall optimization.

In FIGS. 6C and 6D show the results of scheduling, performed by a technique that uses condition vectors, under the constraint that there is one adder available as an arithmetic unit.

In FIG. 6C is a diagram illustrating an example of in-order scheduling and (d) a diagram illustrating an example of scheduling in which speculative execution of a THEN clause and push-down to an ELSE clause have been performed.

With in-order execution in FIG. 6C, a maximum of six cycles are required. In out-of-order execution in FIG. 6D, an improvement is made to a maximum of four cycles (in this case, however, the minimum number of cycles increases from three to four).

In FIG. 6C, operation 1 is executed before condition "c1" is resolved. The ACV, therefore, is [1,1].

In FIG. 6D, on the other hand, out-of-order scheduling is executed, the two additions of the THEN clause (the two additions in v=x+y=z) are assigned to control steps S1 and S2, and the ACV thereof is [1,1]. On the other hand, since operation 1 (t=b+c;) has been scheduled to control step 3 following the conditional operation "c1", ACV is [0,1] and data-dependent mutual exclusiveness can be utilized effectively.

With scheduling using a condition vector, calculation and management of necessary number of arithmetic units need only be performed using the ACV without there being any need to be explicitly aware of control dependency.

With the method of performing code motion in a case where various speculative executions have been performed, an operation referred to as "bookkeeping" is necessary in order to assure consistency of operations. In a case where a condition vector is used, however, code correction (compensation) corresponding to bookkeeping of a compiler is not required. Control in which all execution paths have been optimized systematically can be generated correctly utilizing a scheduled ACV or the results of addition (described later) of ACV when control logic is finally generated.

Scheduling is carried out by comparing the delay time and clock period of an arithmetic unit and taking into consideration whether several sequential operations are allocated to one control step. Accordingly, in a case where a conditional operation and an operation inside a branch have been scheduled in the same cycle, whether the conditional operation has been resolved or is unresolved is decided upon taking delay time of the operation into account.

FIGS. 7A and 7B illustrate the relationship among operation delay, clock period, active condition vector ACV and data path (circuit configuration) synthesized. Behavioral description is illustrated at the top, the corresponding CDFG is illustrated therebelow, and the data path is shown at the bottom.

In FIGS. 7A and 7B, except for the fact that the delays of the conditional operations [(a>b) and (a&&c)] are different, namely 5 ns and 0.5 ns, respectively, the CDFGs are of the same type.

In FIGS. 7A and 7B, it is assumed that the clock period is 7 ns and that the delay of the adder is 5 ns. In the case of FIG. 7A, the arithmetic sum of the delay of the conditional operation a>b and the delay of the addition is 10 ns, which is greater than the clock period of 7 ns. Accordingly, execution cannot be performed sequentially and is performed in parallel. The operation of the conditional a>b therefore is unresolved in a case where the addition operation is executed. Accordingly, the active condition vector ACV of the adder is calculated by the bitwise logical ORed value between its ECV and the ECV [1,1] of the conditional operation and is [1,1].

In the example of FIG. 7B, on the other hand, the sum of the delay of the conditional operation && and the delay of the addition is less than the clock period of 7 ns. Accordingly, the selecting and adding of variables a and c after the condition has been resolved is possible within one clock. [At the time of actual scheduling, scheduling is performed taking the delay of the selector (multiplexer) into consideration. For the sake of simplicity, however, the delay of the selector will not be discussed here.] The active condition vectors ACV of an addition node remain [1,0] and [0,1] because the condition a&&c has been resolved.

These data paths (circuit diagrams) are as illustrated at the bottom of FIGS. 7A and 7B. In FIG. 7A, two adders are required. In FIG. 7B, adder sharing is possible and implementation can be performed with one adder. Delay of an operation thus falls within the clock period.

The arrangement of FIG. 7A means that speculative execution in one clock period is executed. The addition operations (a+b and b+c) are speculatively executed and one is selected by a selector (MUX) depending upon the result of the conditional operation. These data paths also can be formed in a simple manner from the active condition vector ACV.

In FIG. 7A also, in a case where the clock period is 13 ns and greater than the sum of the delays of the comparator and adder, it is possible to begin the addition after the comparison operation is resolved. In this case, therefore, the ACVs of the addition operations remain [1,0], [0,1] and implementation is possible with even one adder. However, there are also cases where even when the clock period is large, it is better to utilize two adders and not share arithmetic units.

That is, the ACV only indicates that sharing is possible. Just because an ACV indicates that sharing is possible does not necessarily mean that sharing is necessary.

As mentioned above, the ACV is decided depending upon whether a conditional operation is resolved or unresolved upon taking into consideration the relationship between delays of a conditional operation and operation inside a branch and the clock period, even in one control step.

A scheduler is adapted to investigate delay and try various schedulings even in one control step. If an ACV is utilized, however, it is possible for mutual exclusiveness in such case to be expressed accurately.

This decision regarding conditional mutual exclusiveness is capable of being applied to operations such as arithmetic operations and also to all operations array access and signal input/output. Condition vectors are attached to all operation nodes of a CDFG and various processing is executed efficiently.

Described next is a method of calculating the minimum necessary number of arithmetic units at each scheduled control step utilizing condition vectors.

FIGS. 8A and 8B illustrate the number of operations f (function) utilized in a behavioral description in the example of FIG. 3C. For example, "TWO" is written above operation node c. This indicates that two of the operations f exist at this position. The same is true for the other nodes as well. This diagram illustrates that operation f does not exist at nodes not having attached numerals indicating number of operations.

Described next is a technique for computing how many arithmetic units to which the operation f is allocated are necessary in a case where two operations f at node c, one operation f at node d, two operations f at node e, one operation f at node f and three operations f at node g in FIG. 8 are scheduled in a certain control step for which all of the conditions c1, c2 and c3 have been resolved.

It is necessary to obtain the minimum necessary number of arithmetic units taking into consideration the fact that c and d, e, f, g are mutually exclusive while d and e, f are not exclusive. This computation can be performed easily and efficiently using condition vectors.

Specifically, first the vector sums of condition vectors of all nodes of the certain operation f are obtained. Since the sum vector represents the necessary number of arithmetic units for every leaf condition, the largest component thereof indicates the smallest necessary number of arithmetic units.

The circumstances of computation of the sum vector are illustrated in FIG. 8B. For example, since "TWO" holds for node c, there are two of c:[1,0,0,0] and the vector is [2,0,0,0].

Furthermore, if all of the vectors of c:two, d:one, e:two, f:one, g:three are vector-summed, we obtain [2,3,2,3].

In other words, this indicates that three of the operations f are required by leaf conditions e and g and two of the operations f are required by the leaf conditions c and f. Accordingly, it will be understood that it will suffice if a minimum of three are prepared.

<FUV>

A vector sum of condition vectors of all operation nodes allocated to a certain arithmetic unit is referred to as an FUV (Function unit Utility condition Vector). The example of FIG. 8 is a basic condition vector BCV. A method of calculating the necessary number of arithmetic units using the FUV can be handled entirely similarly even in a case where the active condition vector ACV is used.

Accordingly, even in the case of speculative execution, the necessary number of arithmetic units can be calculated merely by obtaining the FUV in similar fashion.

It should be noted that the FUV is similarly defined and utilized not only by an arithmetic unit but also by a register to which a variable is allocated, a memory to which an array is allocated and an input/output port to which an input/output variable is allocated. By obtaining the maximum values of the components of these FUVs, it is possible to calculate also the necessary numbers of registers, memories and input/output ports.

<FUV Definition>

$$FUV(f)(i) = \Sigma ACV(f)(i)$$

Here FUV(f) is the FUV of an operation node allocated to an arithmetic unit f in a certain step i. ACV(f) is the ACV of an operation node that has been scheduled in the certain step i.

<FUVall>

A vector sum of ACVs of all operation nodes of the CDFG scheduled to the certain step i is expressed by FUVall(i).

FUVall is utilized when the control logic (Finite State Machine) of a scheduled circuit is generated for example. The details of this will be described in relation to the generation of control logic (see FIGS. 10A and 10B).

The minimum necessary number of arithmetic units is calculated as set forth below.

"necessary number of arithmetic unit $f$"=maximum value of components of $FUV(f)(i)$ At each control step, the maximum value of the components of FUV(f) is the maximum value of the necessary number of operations at this control step. If the maximum value is found among all of the control steps, this will be the necessary number of arithmetic units overall.

<Division of Operating Nodes, Arithmetic-Device Use Vector and Necessary Number of Control Cycles>

Although various examples of speculative execution are illustrated in FIGS. 1A-1E, the speculative executions (out-of-order execution) of FIGS. 1B to 1D can be expressed by an active condition vector ACV.

However, "Duplication-up" at FIG. 1E cannot be implemented by expression of the ACV alone.

Further, "Push-down" at FIG. 1B also can be expressed by the ACV since operation (1) is merely placed inside the ELSE clause in this case. However, if this is inserted by being copied to both the THEN clause and ELSE clause (Duplication-down), expression by the ACV is not possible.

Accordingly, the portions corresponding to Duplication-up and Duplication-down are dealt with by a scheduling technique that utilizes the properties of the condition vector.

An operation for which the number of "1" components of a condition vector is equal to or greater than two can be divided into two or more operation nodes without changing the original operation.

By way of example, the condition vector [1,1,0,1] can be decomposed in the following manner: [1,0,0,0] and [0,1,0,1] or [1,0,0,0] and [0,1,0,0], etc.

This resolution means Duplication-up, Duplication-down as is.

For example, a case where an operation node has been divided into nodes in which there is only one "1" component in the vector, such as in [1,0,0,0], corresponds to division into leaf nodes.

Further, if the vector is decomposed into [1,1,0,0], this corresponds to node division to a level higher than a leaf node.

If node division is performed before scheduling, this runs somewhat counter to the principle that an operation node of a CDFG is not subjected to code motion at the time of scheduling. In a scheduling algorithm, however, this node division is performed "virtually", optimum scheduling is carried out for every "1" component of a condition vector and node division is performed only in a case where it is judged to be advantageous.

Since node division can be scheduled in different control steps every "1" component of the condition vector, scheduling conforming to each path is possible and all paths can be speeded up.

FIGS. 9A-9C illustrate an example of node division and scheduling utilizing this node division.

In FIG. 9C illustrates an example in which an addition (n1) which is the last line s=s+5; of the following behavioral description:

if (c1) $x=a+b-c+d$ else if (c2) $x=y+z+u-v;$ $s=s+5;/*n1*/$ is divided into conditional branches of the upper three branches.

Since the addition s=s+5; (n1) in FIG. 9A is outside the branch, it is always executed and the condition vector is [1] (where [1] is a vector in which all components are 1).

The addition node (n1) is divided into the conditional branches of three branches. That is, it is divided into the three nodes [1,0,0], [0,1,0], [0,0,1].

In FIG. 9B is the result of scheduling the behavioral description in FIG. 9A under the constraint that there is one adder and one subtractor. Since one adder is used in the control steps S1 to S3, the addition (n1) can only be allocated to control step S4.

The reason is that the ACV vector [1,1,1] of the addition n1 is such that the maximum component of FUV+ (arithmetic-device utilization-degree vector) is "2" in any of the control steps of control steps S1 to S3. It should be noted that the "+" of FUV+ is indicative of the FUV of the adder.

However, if an operation is divided into three nodes, as illustrated at FIG. 9C, scheduling is performed randomly to control cycles of "0" components (a condition for which addition is not performed) of arithmetic-device utilization-degree vector FUV+ with respect to the addition, whereby the maximum component of FUV+ is held at "1" and allocation is performed from control step S1 to S3. The three divided nodes (the ACVs are [0,0,1], [1,0,0] and [0,1,0], respectively) are allocated from control step S1 to S3 and the respective FUV+'s are [1,1,1], [1,0,0] and [1,1,0]. It is possible to perform scheduling to the three control steps S1, S2 and S3.

That is, in the above branches of the behavioral description, adders are not used under all conditions in all states. Rather, by performing scheduling utilizing a portion that is not used under a certain condition in a certain state, as illustrated at FIG. 9C, the number of execution cycles can be reduced.

Since an FUV indicates the necessary number of arithmetic units for every condition, it is easy to optimize scheduling of every condition as in this example.

FUVall on the right side at FIGS. 9B and 9C is the overall vector sum of ACVs of all operation nodes scheduled to this control step.

For example, at control step S2 in FIG. 9B, there is subtraction at [1,0,0] and addition at [0,1,0]. Accordingly, FUVall(S2) is given by the vector sum [1,0,0]+[0,1,0] and we obtain FUVall(S2)=[1,1,0]. The same is true for the others as well.

Consider a case where a component of FUVall is "0". In FUVall, the condition vectors of all operations are summed. Therefore, at control step S2, for example, a leaf condition of a "0" component indicates that no operation whatsoever is carried out. That is, with this leaf condition, it is indicated that this control step can be skipped.

Accordingly, a path-length vector, which is a vector obtained by adding the number of non-zero components of FUVall with respect to all control steps, indicates the necessary number of steps of every leaf condition of the condition vector.

The path-length vector is [4,4,1] in FIG. 9B and [3,3,1] in FIG. 9C.

This indicates that while four cycles, four cycles and one cycle were required for every leaf condition in FIG. 9B, the numbers are reduced to three cycles, three cycles and one cycle, respectively, in FIG. 9C.

FIGS. 10A and 10B illustrate an example in which a state transition of an FSM (Finite State Machine) of a control circuit is generated from FUVall, which has been obtained from a certain scheduling result, by skipping zero components of FUVall. In FIG. 10A is a diagram illustrating FUVall with respect to a scheduling result, and 10B is a diagram illustrating generated state transitions of an FSM for control.

A control-logic generating algorithm with respect to a single (nested) conditional branch comprises steps 1) to 5) below.

1) Adopt a first control step as a first state.
2) Current_step=first state
3) Find a control step in which FUVall components other than "0" are found for every leaf condition of the condition vector of Current_Step, and enter next_step. Obtain the next state of every leaf condition from Current_Step.
4) current_step=current_step+1;
5) End if current_step is the final step, or transition to step 3) if current_step is not the final step.

In the example of FIGS. 10A and 10B, the initial state is assumed to be S1. Further, the leaf conditions of the condition vectors are denoted c1, c2 and c3 in order.

The next-state transition destinations of initial state S1 (FUVall is [1,2,3]) are S3, S4 and S3 in the order of the bits of the condition vectors.

The transition destination from state S2 is state S3 only.

From step S3 a transition is made to step S4 with conditions c1 and c3. Accordingly, the following state transitions are obtained:

```
switch (ST)   {
    case S1:   if (c1) goto S2;
    if (c2) goto S4;
    if (c3) goto S3;
    case S2 : goto S3;
    case S3 : goto S4
    case S4: end, go to next statement
}
```

Here ST indicates a state register, and goto S2 indicates transition to S2.

This example indicates a control-logic generating method with respect to the conditional branch of one top level. (As will be described later, the present invention proposes a method of parallelizing multiple top-level conditional branches.)

With regard to FUV and FUVall, refer to the content of Non-Patent Document 1, etc.

Patent Document 1

Japanese Patent Kokai Publication No. JP-A-5-334466

Patent Document 2

Japanese Patent Kokai Publication No. JP-A-5-334391

Non-Patent Document 1

Kazutoshi Wakabayashi and Hiroshi Tanaka, "Global Scheduling Independent of Control Dependencies based on Condition Vectors," Proc. of 29th ACM/IEEE Design Automation Conference, pp. 112-115, 1992, 6

SUMMARY OF THE DISCLOSURE

The entire disclosure of Patent Documents 1, 2 and Non-Patent Document 1 are incorporated herein by reference thereto.

As mentioned above, merely by investigating FUV or FUVall, the number of arithmetic devices and the number of execution cycles of each path can be computed immediately even in a case where a variety of speculative executions are performed. Therefore, with the prospect of the ability to reduce the overall number of cycles, scheduling can be performed with an efficient amount of computation. This point also is one important feature of a condition vector.

In a case where top-level IF statements are parallelized, an optimum state transition can be generated merely by skipping 0 components of the sum vector FUVall of the ACVs of all operations. Thus, although a condition vector can handle conditional multiple mutual exclusiveness and speculation, nested conditional branches have two constraints.

One is a constraint relating to speculative execution of conditional operations in nested conditional branches.

The other constraint is that accurate representation of conditional mutual exclusiveness of parallel branches in nested conditional branches cannot be performed.

Accordingly, an object of the present invention is to provide an automated synthesis apparatus, method and program for solving the foregoing problems.

According to the present invention, there is provided an automated synthesis apparatus comprising:

a condition vector generating unit that generates a generalized condition vector (GCV) that includes valid bits that are set in consecutive components of a portion of the vector in a case where, with respect to one operation node in the behavioral description, an outer conditional operation to said one operation node is unresolved and, moreover, an inner conditional operation to said one operation node is resolved, the valid bits being bits at positions where components of an extended condition vector (ECV) of the inner side resolved conditional operation are 1's; and a scheduling unit that performs scheduling, which includes processing for allocating an operation to a cycle, based upon a generalized condition vector (GCV) given to an operation node of a control/data flow graph corresponding to the behavioral description.

In the apparatus according to the present invention, the scheduling unit performs speculative execution of a conditional operation in a conditional branch and/or parallelization of multiple conditional statements.

In the apparatus according to the present invention, the condition vector generating unit obtains the generalized condition vector (GCV) by taking the bitwise logical OR between an extended condition vector (ECV) of one operation node in the behavioral description and an extended condition vector (ECV) of an outside unresolved conditional operation to which the one operation node belongs, the bitwise logical OR being performed with masking by components 1's of valid bids of the inside resolved condition.

In the apparatus according to the present invention, the condition vector generating unit allocates, to a leaf node of a conditional branch, a basic condition vector (BCV) of mutually one-dimensional independent code in which the number of dimensions is equal to the number of leaves and which has a 1 at only one component; a basic condition vector (BCV) of a parent node being calculated by a bitwise logical OR between basic condition vectors of child nodes; and obtains an extended condition vector (ECV), in which the number of dimensions is equal to the number of leaves, of a node immediately preceding a join node of the control/data flow graph, by a basic condition vector (BCV) of the node immediately preceding the join node, and an extended condition vector (ECV) of another operation node that is calculated by the bitwise logical OR between extended condition vectors (ECV) of succeeding operations of the data flow.

In the apparatus according to the present invention, when it is assumed that an extended condition vector (ECV) of one operation node in the behavioral description is an ECV (operation node), that an extended condition vector (ECV) of the outside unresolved conditional operation is an ECV (outside unresolved condition), and that an extended condition vector (ECV) of the inner side resolved conditional operation is an ECV (inside resolved condition), a generalized condition vector (GCV) of the one operation node is obtained by ECV (operation node)|{(~ECV (inside resolved condition)) & ECV (outside unresolved condition)} where ~, | and & denote a bit inversion operation, a bitwise logical sum (OR) and a bitwise logical multiplication (AND), respectively.

In the apparatus according to the present invention, the scheduling unit determines whether or not there is a possibility of sharing an arithmetic unit between operation nodes depending upon whether or not identical components of corresponding valid bits do not have a 1. In the apparatus according to the present invention, the scheduling unit decides "mutually exclusive" if identical bit positions between valid bits of a node do not have a 1, and decides "not mutually exclusive" if the identical bit positions have a 1. In the apparatus according to the present invention, the scheduling unit is such that the determination of mutual exclusiveness of an operation in a generalized condition vector (GCV) regards components other than those of valid bits as 0's. In the apparatus according to the present invention, the scheduling unit checks mutual exclusiveness depending upon whether 1's do not overlap at identical positions in a case where valid-bit positions do not overlap.

In the apparatus according to the present invention, the condition vector generating unit, in obtaining the generalized condition vector (GCV) at the time of speculative execution of a conditional operation, initializes to 0 the components of a guard vector that performs masking in the bitwise logical OR, then repeats the following as loop processing from an inner conditional operation ci to an outside conditional operation:

substituting an extended condition vector ECV(n) of an operation node n into a generalized condition vector GCV(n) of an operation node;

in a case where a conditional operation ci (where ci is a condition, of an order higher than its own, of the conditional branch to which the node n belongs) has been re, setting a valid bit with an extended condition vector ECV(ci) of the conditional operation ci serving as a guard vector; and in a case where the conditional operation ci is unresolved, adopting GCV(ni)|(~guard vector & ECV(ci)) as GCV(n)

where ~, | and & denote a bit inversion operation, a bitwise logical OR and a bitwise logical AND, respectively.

In the apparatus according to the present invention, the scheduling unit, in obtaining an FUV (Function unit Utility condition Vector), which is a vector sum of condition vectors of all nodes allocated to a certain arithmetic unit, using a generalized condition vector (GCV), creates a set S of generalized condition vectors (GCV) of mutually overlapping valid bits;

collects all vectors having no valid bits into one set S0;

repeats the processing of the following { } with regard to each set S:

{for GCV in the set S, repeating processing for adopting the result of vector addition of FUV(s) and GCV as FUV(s)};

performs ordinary vector addition of FUV of all S and S0;

performs vector addition with components other than those of valid bits serving as 0; and after addition, sets the value of the largest component among the valid bits to other than a valid bit portion.

In the apparatus according to the present invention, the scheduling unit handles at least first and second conditional statements, which have been placed in parallel in a branch in the behavioral description, as a control structure identical with a control structure speculatively executed before the first and second conditional statements, in which the first and second conditional statements are placed in respective branches of a conditional in which the conditional operation is unresolved; thereby making parallel conditional statements inside a branch and speculative execution of a conditional able to me represented by a generalized condition vector (GCV) having valid bits.

In the apparatus according to the present invention, the scheduling unit handles an operation belonging to a different top-level conditional branch as one having virtually unified generalized condition vectors (GCVs) with respect to multiple conditional branch statements arrayed in a top level in the behavioral description, handles the operation belonging to the different top-level conditional branch in the manner of an operation in one basic block at the time of scheduling, and schedules the operation node belonging to the different top-level conditional branch in any order.

In the apparatus according to the present invention, the scheduling unit performs global optimization across basic blocks in relation to speculative execution and/or path length utilizing a generalized condition vector (GCV) given to an operation node of the control/data flow graph.

In the apparatus according to the present invention, the scheduling unit utilizes the generalized condition vector (GCV) to perform scheduling freely, even between operations among multiple conditional branches, based upon a prescribed priority function relating to distance (maximum distance, probability distance), and performs global speculative execution for parallelizing multiple conditional branches.

In the apparatus according to the present invention, the scheduling unit, in generating control logic in a case where conditional branches have been parallelized, obtains FUVall relating to a generalized condition vector (GCV) for every one in which valid bits overlap, where FUVall is a vector sum of active condition vectors (ACV) of all operation nodes of a control/data flow graph scheduled to a certain control step, where the active condition vector ACV with respect to an operation node n is given by ECV(n) or ECV(Ci) or ECV(Cj) or . . . or ECV(Ck), where Ci, Cj, . . . Ck are terminal nodes of conditionals of conditional branches to which the node n belongs and are unresolved in this control step of obtaining ACV; and generates a control circuit so as to skip 0 of the FUVall with respect to each of the conditional branches.

In the apparatus according to the present invention, the scheduling unit handles state transitions of nodes of generalized condition vectors (GCV) in which valid bits do not overlap as parallel conditional branch statements and, in order to merge a plurality of synchronous state transitions into one FSM (finite state machine), obtains a jump destination to which a jump is possible and the condition thereof in all branches of respective state transitions.

According to another aspect of the present invention, the foregoing object is attained by providing an automated synthesis method comprising:

a step of creating a condition vector with respect to a node in a behavioral description; wherein the step of creating a condition vector includes generating a generalized condition vector (GCV) that includes valid bits that are set in consecutive components of a portion of the vector in a case where, with respect to one operation node in the behavioral description, an outer conditional operation to said one operation node is unresolved and an inner conditional operation to said one operation node is resolved, the valid bits being bits at positions where components of an extended condition vector (ECV) of the inner side resolved conditional operation are 1's; and a scheduling step of executing scheduling processing, which includes processing for allocating an operation to a cycle, based upon a generalized condition vector (GCV) given to an operation node of a control/data flow graph corresponding to the behavioral description.

In the method according to the present invention, the scheduling step performs speculative execution of a conditional operation in a conditional branch and/or parallelization of multiple conditional statements.

In the method according to the present invention, the step of creating the condition vector obtains the generalized condition vector (GCV) by taking the bitwise logical OR between an extended condition vector (ECV) of one operation node in the behavioral description and an extended condition vector (ECV) of an outside unresolved conditional operation to which the one operation node belongs, the bitwise logical OR being performed with masking by components 1's of valid bids of the inside resolved condition.

In the method according to the present invention, a basic condition vector (BCV) of mutually one-dimensional independent code in which the number of dimensions is equal to the number of leaves and which has a 1 at only one component is allocated to a leaf node of a conditional branch; a basic condition vector (BCV) of a parent node is calculated by a bitwise logical OR between basic condition vectors of child nodes; and an extended condition vector (ECV), in which the number of dimensions is equal to the number of leaves, of a node immediately preceding a join node of the control/data flow graph is given by a basic condition vector (BCV) of the node immediately preceding the join node, and an extended condition vector (ECV) of another operation node is calculated by the bitwise logical ORed value between extended condition vectors (ECV) of succeeding operations of the data flow.

In the method according to the present invention, when it is assumed that an extended condition vector (ECV) of one operation node in the behavioral description is an ECV (operation node), that an extended condition vector (ECV) of the outside unresolved conditional operation is an ECV (outside unresolved condition), and that an extended condition vector (ECV) of the inner side resolved conditional operation is an ECV (inside resolved condition), a generalized condition vector (GCV) of the one operation node is obtained by ECV (operation node)|{(~ECV (inside resolved condition)) & ECV (outside unresolved condition)} where ~, | and & denote a bit inversion operation, a bitwise logical OR and a bitwise logical AND, respectively.

In the method according to the present invention, whether or not there is a possibility of sharing an arithmetic unit between operation nodes is decided depending upon whether or not identical components of corresponding valid bits do not have a 1. Mutual exclusiveness is decided if identical bit positions between valid bits of a node do not have a 1, and non-mutual exclusiveness is decided if the identical bit positions have a 1.

In the method according to the present invention, in obtaining the generalized condition vector (GCV) at the time of speculative execution of a conditional operation, the method further includes the steps of: initializing to 0 the components of a guard vector that performs masking in the bitwise logical OR, then repeating the following as loop processing from an inner conditional operation ci to an outside conditional operation: substituting an extended condition vector ECV(n) of an operation node n into a generalized condition vector GCV(n) of an operation node; in a case where a conditional operation ci (where ci is condition, of an order higher than its own, of the conditional branch to which the node n belongs) has been resolved, setting a valid bit with an extended condition vector ECV(ci) of the conditional operation ci serving as a guard vector; and in a case where the conditional operation ci is unresolved, adopting GCV(ni)|(~guard vector & ECV(ci)) as GCV(n) (where ~, | and & denote a bit inversion operation, a bitwise logical OR and a bitwise logical AND, respectively).

In the method according to the present invention, in obtaining an FUV (Function unit Utility condition Vector), which is a vector sum of condition vectors of all nodes allocated to a certain arithmetic unit, using a generalized condition vector (GCV), the method further includes the steps of: creating a set S of generalized condition vectors (GCV) of mutually overlapping valid bits; collecting all vectors having no valid bits into one set S0; repeating the processing of the following { } with regard to each set S: {with regard to the GCVs in the set S, repeating processing for adopting the result of vector addition of FUV(s) and GCV as FUV(s)}; performing ordinary vector addition of FUV of all S and S0; performing vector addition with components other than those of valid bits serving as 0; and after addition, setting the value of the largest component among the valid bits to a value other than valid bit portion.

In the method according to the present invention, at least first and second conditional statements, which have been placed in parallel in a branch in the behavioral description, are handled as a control structure identical with a control structure speculatively executed before the first and second conditional statements, in which the first and second conditional statements are placed in respective branches of a conditional in which the conditional operation is unresolved; and parallel conditional statements inside a branch and speculative execution of a conditional are made able to be represented systematically by a generalized condition vector (GCV) having valid bits.

In the method according to the present invention, the method further includes the steps of handling an operation belonging to a different top-level conditional branch as one having virtually unified generalized condition vectors (GCV) with respect to multiple conditional branch statements arrayed in a top level in the behavioral description, handling the operation belonging to the different top-level conditional branch in the manner of an operation in one basic block at the time of scheduling, and scheduling the operation node belonging to the conditional branch of the different top level in any order.

In the method according to the present invention, the method further includes the steps of performing global optimization across basic blocks in relation to speculative execution and/or path length utilizing a generalized condition vector (GCV) given to an operation node of the control/data flow graph.

In the method according to the present invention, the method further includes the steps of utilizing the generalized condition vector (GCV) to perform scheduling freely, even between operations among multiple conditional branches, based upon a prescribed priority function relating to distance, and performing global speculative execution for parallelizing multiple conditional branches.

In the method according to the present invention, in generating control logic in a case where conditional branches have been parallelized, the method further includes the steps of
obtaining FUVall relating to a generalized condition vector (GCV) for every one in which valid bits overlap,
where FUVall is a vector sum of active conditions vectors (ACV) of all operation nodes of a control/data flow graph scheduled to a certain control step,
where the active condition vector ACV with respect to an operation node n is given by ECV(n) or ECV(Ci) or ECV(Cj) or . . . or ECV(Ck), where Ci, Cj, . . . Ck are terminal nodes of conditionals of conditional branches to which the node n belongs and are unresolved in this control step of obtaining ACV;
and generating a control circuit so as to skip 0 of the FUVall with respect to each of the conditional branches.

In the method according to the present invention, the method further includes the steps of handling state transitions of nodes of generalized condition vectors (GCV) in which valid bits do not overlap as parallel conditional branch statements and, in order to merge a plurality of simultaneous state transitions into one FSM (finite state machine), obtaining a jump destination to which a jump is possible and the condition thereof in all branches of respective state transitions.

According to a further aspect of the present invention, there is provided a computer program for causing a computer to execute:
processing for creating a condition vector with respect to a node in a behavioral description; wherein the processing for creating the condition vector generates a generalized condition vector (GVC) that includes valid bits that are set in consecutive components of a portion of the vector in a case where, with respect to one operation node in the behavioral description, an outer conditional operation to said one operation node is unresolved and, moreover, an inner conditional operation to said one operation node is resolved, the valid bits being bits at positions where components of an extended condition vector (ECV) of the inner side resolved conditional operation are 1's; and
scheduling processing for performing scheduling, which includes processing for allocating an operation to a cycle, based upon a generalized condition vector (GCV) given to an operation node of a control/data flow graph corresponding to the behavioral description.

In the computer program according to the present invention, the scheduling processing performs speculative execution of a conditional operation in a conditional branch and/or parallelization of multiple conditional statements.

In the computer program according to the present invention, the processing for creating the condition vector obtains the generalized condition vector (GCV) by taking the bitwise logical OR between an extended condition vector (ECV) of one operation node in the behavioral description and an extended condition vector (ECV) of an outside unresolved conditional operation to which the one operation node by components 1's of valid bids of the inside resolved condition.

In the computer program according to the present invention, a basic condition vector (BCV) of mutually one-dimensional independent code in which the number of dimensions is equal to the number of leaves and which has a 1 at only one component is allocated to a leaf node of a conditional branch; a basic condition vector (BCV) of a parent node is calculated by a bitwise logical OR between basic condition vectors of child nodes; and an extended condition vector (ECV), in which the number of dimensions is equal to the number of leaves, of a node immediately preceding a join node of the control/data flow graph is given by a basic condition vector (BCV) of the node immediately preceding the join node, and an extended condition vector (ECV) of another operation node is calculated by the bitwise logical ORed value between extended condition vectors (ECV) of succeeding operations of the data flow.

In the computer program according to the present invention, when it is assumed that an extended condition vector (ECV) of one operation node in the behavioral description is an ECV (operation node), that an extended condition vector (ECV) of the outside unresolved conditional operation is an ECV (outside unresolved condition), and that an extended condition vector (ECV) of the inner side resolved conditional operation is an ECV (inside resolved condition), a generalized condition vector (GCV) of the one operation node is obtained by ECV (operation node)|{(~ECV (inside resolved condition)) & ECV (outside unresolved condition)} where ~, | and & denote a bit inversion operation, a bitwise logical OR and a bitwise logical AND, respectively.

In the computer program according to the present invention, in obtaining the generalized condition vector (GCV) at the time of speculative execution of a conditional operation, the program further includes: processing for initializing to 0 the components of a guard vector that performs masking in the bitwise logical OR; and the following processing, which is repeated, from an inner conditional operation ci to an outside conditional operation: substituting an extended condition vector ECV(n) of an operation node n into a generalized condition vector GCV(n) of an operation node; in a case where a conditional operation ci, where ci is condition, of an order higher than its own, of the conditional branch to which the node n belongs, has been resolved, setting a valid bit with an extended condition vector ECV(ci) of the conditional operation ci serving as a guard vector; and in a case where the conditional operation ci is unresolved, adopting GCV(ni)|(~guard vector & ECV(ci)) as GCV(n)

where ~, | and & denote a bit inversion operation, a bitwise logical OR and a bitwise logical AND, respectively.

In the computer program according to the present invention, in obtaining an FUV (Function unit Utility condition Vector), which is a vector sum of condition vectors of all nodes allocated to a certain arithmetic unit, using a generalized condition vector (GCV), the program further includes:

creating a set S of generalized condition vectors (GCV) of mutually overlapping valid bits;

collecting all vectors having no valid bits into one set S0;

repeating the processing of the following { } with regard to each set S:

{with regard to the GCVs in the set S, repeating processing for adopting the result of vector addition of FUV(s) and GCV as FUV(s)};

performing ordinary vector addition of FUV of all S and S0; performing vector addition with components other than those of valid bits serving as 0; and after addition, setting the value of the largest component among the valid bits to a value other than valid bit portion.

In the computer program according to the present invention, at least first and second conditional statements, which have been placed in parallel in a branch in the behavioral description, are handled as a control structure identical with a control structure speculatively executed before the first and second conditional statements, in which the first and second conditional statements are placed in respective branches of a conditional in which the conditional operation is resolved; and parallel conditional statements inside a branch and speculative execution of a conditional are made able to be represented systematically by a generalized condition vector (GCV) having valid bits.

In the computer program according to the present invention, the program further includes handling an operation belonging to a different top-level conditional branch as one having virtually unified generalized condition vectors (GCVs) with respect to multiple conditional branch statements arrayed in a top level in the behavioral description, handling the operation belonging to the different top-level conditional branch in the manner of an operation in one basic block at the time of scheduling, and scheduling the operation node belonging to the different top-level conditional branch in any order.

In the computer program according to the present invention, the program further includes performing global optimization across basic blocks in relation to speculative execution and/or path length utilizing a generalized condition vector (GCV) given to an operation node of the control/data flow graph.

In the computer program according to the present invention, the program further includes utilizing the generalized condition vector (GCV) to perform scheduling freely, even between operations among multiple conditional branches, based upon a prescribed priority function relating to distance, and performing global speculative execution for parallelizing multiple conditional branches.

In the computer program according to the present invention, in generating control logic in a case where conditional branches have been parallelized, the computer program further includes:

obtaining FUVall relating to a generalized condition vector (GCV) for every one in which valid bits overlap, where FUVall is a vector sum of active conditions vectors (ACV) of all operation nodes of a control/data flow graph scheduled to a certain control step, where the active condition vector ACV with respect to an operation node n is given by ECV(n) or ECV(Ci) or ECV(Cj) or . . . or ECV(Ck), where Ci, Cj, . . . Ck are terminal nodes of conditionals of conditional branches to which the node n belongs and are unresolved in this control step of obtaining ACV; and generating a control circuit so as to skip 0 of the FUVall with respect to each of the conditional branches.

In the computer program according to the present invention, the program further includes handling state transitions of nodes of generalized condition vectors (GCV) in which valid bits do not overlap as a parallel conditional branch statement and, in order to merge a plurality of simultaneous state transitions into one FSM (finite state machine), obtaining a jump destination to which a jump is possible and the condition thereof in all branches of respective state transitions.

According to a further aspect of the present invention, there is provided a compiler apparatus for inputting source statements and generating codes for a processor capable of executing operations in parallel using a plurality of operation resources, comprising:

a condition vector generating unit that generates a generalized condition vector (GCV) that includes valid bits that are set in consecutive components of a portion of the vector in a case where, with respect to one operation node in the behavioral description, an outer conditional operation to said one operation node is unresolved and, moreover, an inner conditional operation to said one operation node is resolved, the valid bits being bits at positions where components of an extended condition vector (ECV) of the inner side resolved conditional operation are 1's; and a scheduling unit that performs scheduling, which includes processing for allocating an operation to a cycle, based upon a generalized condition vector (GCV) given to an operation node of a control/data flow graph corresponding to the behavioral description.

In the compiler apparatus according to the present invention, the scheduling unit performs optimization that includes speculative execution of a conditional operation in a conditional branch and/or parallelization of multiple conditional statements.

In the compiler apparatus according to the present invention, the condition vector generating unit obtains the generalized condition vector (GCV) by taking the bitwise logical OR between an extended condition vector (ECV) of one operation node in the behavioral description and an extended condition vector (ECV) of an outside unresolved conditional operation to which the one operation node belongs, the bitwise logical OR being performed with masking by components 1's of valid bids of the inside resolved condition.

In the compiler apparatus according to the present invention, the condition vector generating unit allocates, to a leaf node of a conditional branch, a basic condition vector (BCV) of mutually one-dimensional independent code in which the number of dimensions is equal to the number of leaves and which has a 1 at only one component; a basic condition vector (BCV) of a parent node being calculated by a bitwise logical OR between basic condition vectors of child nodes; and obtains an extended condition vector (ECV), in which the number of dimensions is equal to the number of leaves, of a node immediately preceding a join node of the control/data flow graph by a basic condition vector (BCV) of the node immediately preceding the join node, and an extended condition vector (ECV) of another operation node calculated by the bitwise logical ORed value between extended condition vectors (ECV) of succeeding operations of the data flow.

In the compiler apparatus according to the present invention, when it is assumed that an extended condition vector (ECV) of one operation node in the behavioral description is an ECV (operation node), that an extended condition vector (ECV) of the outside unresolved conditional operation is an ECV (outside unresolved condition), and that an extended condition vector (ECV) of the inner side resolved conditional operation is an ECV (inside resolved condition), a generalized condition vector (GCV) of the one operation node is obtained by ECV (operation node)|{(~ECV (inside resolved condition)) & ECV (outside unresolved condition)} where ~, | and & denote a bit inversion operation, a bitwise logical OR and a bitwise logical AND, respectively.

In the compiler apparatus according to the present invention, the scheduling unit determines whether or not there is a possibility of sharing an arithmetic unit between operation nodes depending upon whether or not identical components of corresponding valid bits do not have a 1. The scheduling unit decides "mutually exclusive" if identical bit positions between valid bits of a node do not have a 1, and decides "not mutually exclusive" if the identical bit positions have a 1. The scheduling means is such that the determination of mutual exclusiveness of an operation in a generalized condition vector (GCV) regards components other than those of valid bits as 0's. The scheduling unit checks mutual exclusiveness depending upon whether 1's do not overlap at identical positions in a case where valid-bit positions do not overlap.

In the compiler apparatus according to the present invention, the condition vector generating unit, in obtaining the generalized condition vector (GCV) at the time of speculative execution of a conditional operation, initializes to 0 the components of a guard vector that performs masking in the bitwise logical OR, then repeats the following as loop processing from an inner conditional operation ci to an outside conditional operation:

substituting an extended condition vector ECV(n) of an operation node n into a generalized condition vector GCV(n) of an operation node;

in a case where a conditional operation ci, where ci is a condition, of an order higher than its own, of the conditional branch to which the node n belongs, is resolved, setting a valid bit with an extended condition vector ECV(ci) of the conditional operation ci serving as a guard vector; and in a case where the conditional operation ci is unresolved, adopting GCV(ni)|(~guard vector & ECV(ci)) as GCV(n)

where ~, | and & denote a bit inversion operation, a bitwise logical OR and a bitwise logical AND, respectively.

In the compiler apparatus according to the present invention, the scheduling unit, in obtaining an FUV (Function unit Utility condition Vector), which is a vector sum of condition vectors of all nodes allocated to a certain arithmetic unit, using a generalized condition vector (GCV), creates a set S of generalized condition vectors (GCV) of mutually overlapping valid bits;

collects all vectors having no valid bits into one set S0;

repeats the processing of the following { } with regard to each set S:

{for GCV in the set S, repeating processing for adopting the result of vector addition of FUV(s) and GCV as FUV(s)};

performs ordinary vector addition of FUV of all S and S0;

performs vector addition with components other than those of valid bits serving as 0; and after addition, sets the value of the largest component among the valid bits to other than a valid bit portion.

In the compiler apparatus according to the present invention, the scheduling unit handles at least first and second conditional statements, which have been placed in parallel in a branch in the behavioral description, as a control structure identical with a control structure speculatively executed before the first and second conditional statements, in which the first and second conditional statements are placed in respective branches of a conditional in which the conditional operation is unresolved; enabling the systematic representation of conditional statements inside a branch and speculative execution of a conditional by a generalized condition vector (GCV) having valid bits.

In the computer apparatus according to the present invention, the scheduling unit handles an operation belonging to a different top-level conditional branch as one having virtually unified generalized condition vectors (GCVs) with respect to multiple conditional branch statements arrayed in a top level in the behavioral description, handles the operation belonging to the different top-level conditional branch in the manner of an operation in one basic block at the time of scheduling, and schedules the operation node belonging to the different top-level conditional branch in any order.

In the compiler apparatus according to the present invention, the scheduling unit performs global optimization across basic blocks in relation to speculative execution and/or path length utilizing a generalized condition vector (GCV) given to an operation node of the control/data flow graph.

In the compiler apparatus according to the present invention, the scheduling unit utilizes the generalized condition vector (GCV) to perform scheduling freely, even between operations among multiple conditional branches, based upon a prescribed priority function relating to distance (maximum distance, probability distance), and performs global speculative execution for parallelizing multiple conditional branches.

The meritorious effects of the present invention are summarized as follows.

In accordance with the present invention, speculative execution of conditional operations in nested conditional branches can be carried out by introducing a generalized condition vector that is capable of representing speculative execution relating to all types of conditional branches.

In accordance with the present invention, accurate representation of conditional mutual exclusiveness of parallel branches in nested conditional branches is possible.

In accordance with the present invention, in the parallelization of multiple conditional branches based upon a generalized condition vector GCV, it is possible to calculate the necessary number of arithmetic units even between operations among multiple conditional branches. As a result, scheduling is possible in order of decreasing priority functions without being concerned with the affiliated conditional branch, control dependency of conditional branches is removed in every sense, and it is possible to perform parallelization with just data dependency. In accordance with the present invention, operation nodes to which GCVs have been attached may be handled as if they were all inside a basic block, and various (local) scheduling algorithms developed for application to a basic block are applicable to global scheduling.

Other features and advantages of the present invention will be apparent from the following description taken in conjunction with the accompanying drawings, in which like reference characters designate the same or similar parts throughout the figures thereof.

BRIEF DESCRIPTIONS OF THE DRAWINGS

FIGS. 1A, 1B, 1C, 1D and 1E are diagrams illustrating an example of local speculative execution: speculative execution with respect to a single conditional branch;

FIGS. 5A, 5B, 5C and 5D are diagrams useful in describing an operation condition vector and speculative execution;

FIGS. 6A, 6B, 6C and 6D are diagrams useful in describing speculative execution and ECV, ACV;

FIGS. 11A and 11B are diagrams useful in describing speculative execution and GCV of conditions inside nested conditional statements;

FIG. 12 is a diagram useful in describing nested conditional statements and GCV having partially unresolved conditions;

FIG. 13 is a diagram illustrating, in the form of a list, GCVs in a case where various conditions in the example of FIG. 12 are unresolved;

FIGS. 15A, 15B, 15C and 15D are diagrams useful in describing handling of parallel IF statements inside a nested branch as an extension of GCV;

FIGS. 16A, 16B and 16C are diagrams useful in describing multiple parallel conditional statements in a branch, GCVs, tree copy and tree division;

FIGS. 17A and 17B are diagrams useful in describing consistency between in-branch parallel conditional statements and conditional statements of partially unresolved conditions;

FIG. 19 is a diagram illustrating an example of top-level conditional branches and GCVs;

FIGS. 21A and 21B are diagrams useful in describing an example of parallelization of top-level parallel IF statements;

FIGS. 22A and 22B are diagrams useful in describing synthesis of an FSM that controls multiple parallel branches;

FIG. 24 is a diagram comparing and illustrating results of scheduling of a parallel conditional branch in a branch according to the present invention and the prior art;

FIG. 25 is a diagram comparing and illustrating a loop pipeline according to the present invention and the prior art.

PREFERRED MODES OF THE INVENTION

Figure 2:
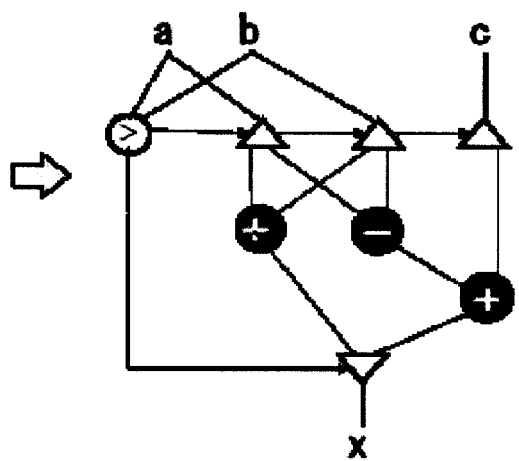
FIG. 2 is a diagram illustrating an example of a control/data flow graph (CDFG)
Figure 3A:
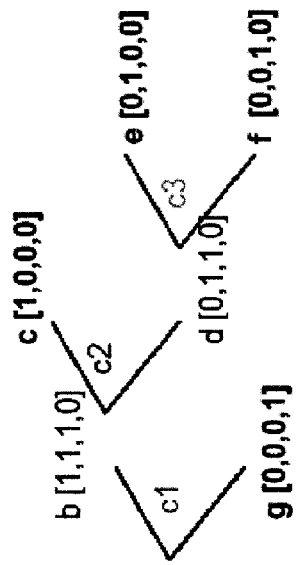
FIGS. 3A, 3B, 3C and 3D are diagrams illustrating examples of basic condition vectors.
Figure 3C:
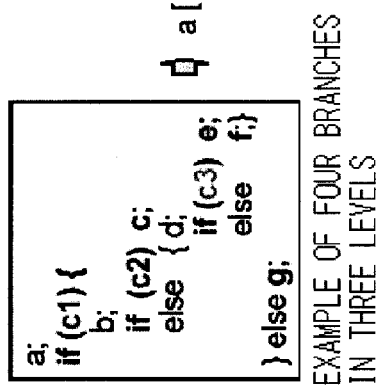
Figure 3B:
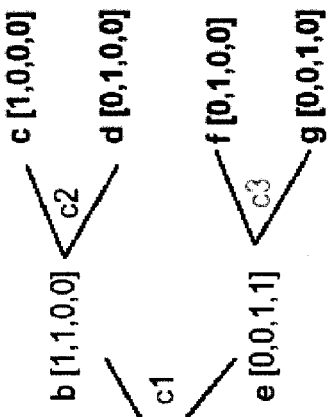
Figure 3D:
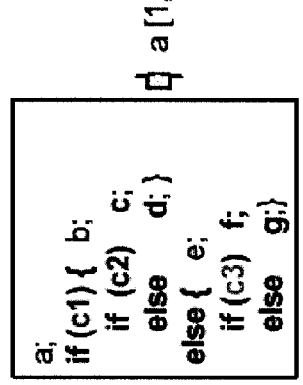
Figures 4A, 4B, 4C:
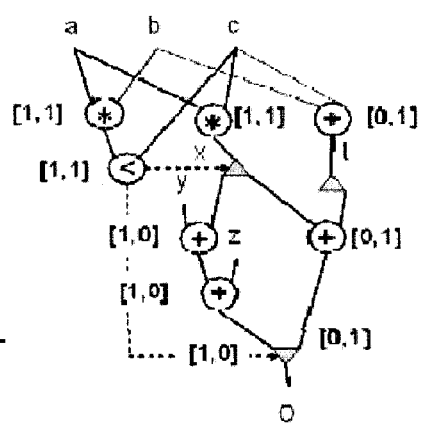
FIGS. 4A, 4B and 4C are diagrams illustrating examples of extended condition vectors.
Figure 7A:
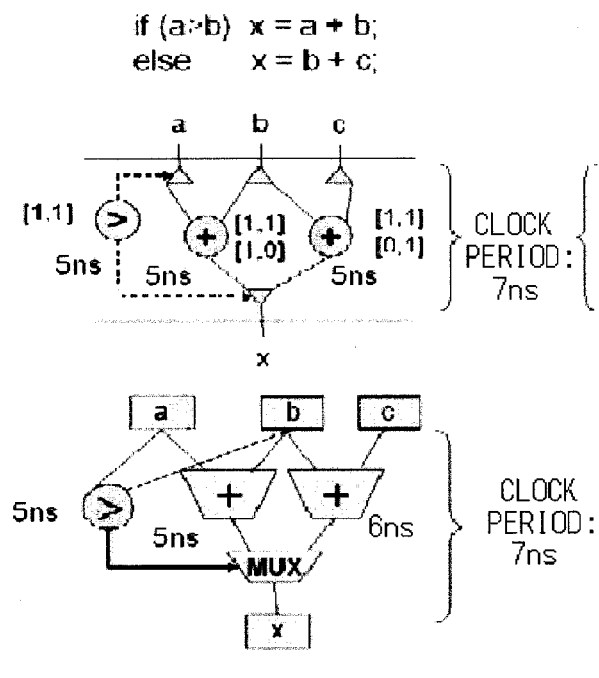
FIGS. 7A and 7B are diagrams useful in describing the relationship among operation delay, clock period and ACV.
Figure 7B:
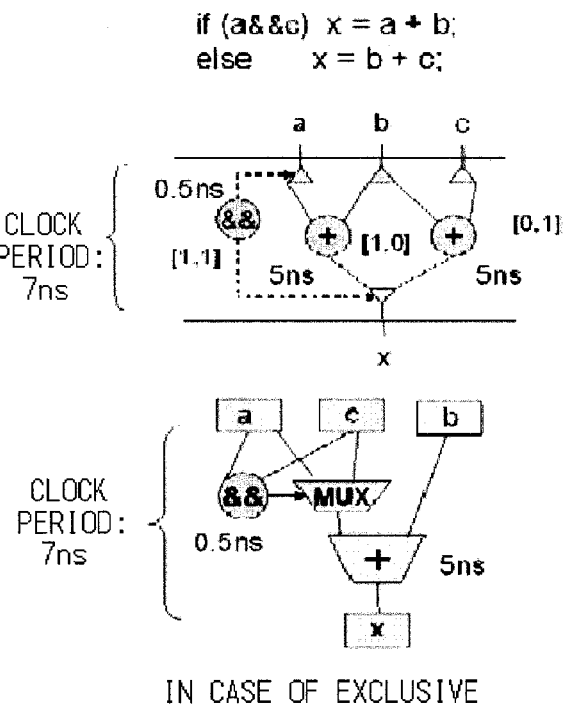
Figures 8A, 8B:
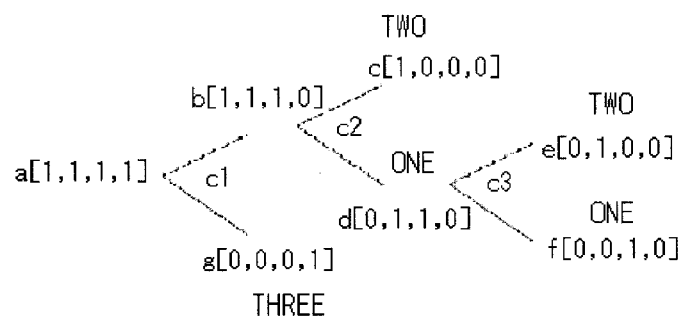
FIGS. 8A and 8B are diagrams useful in describing the relationship between a method of calculating a necessary number of arithmetic units and FUV.
Figures 9A, 9B, 9C:
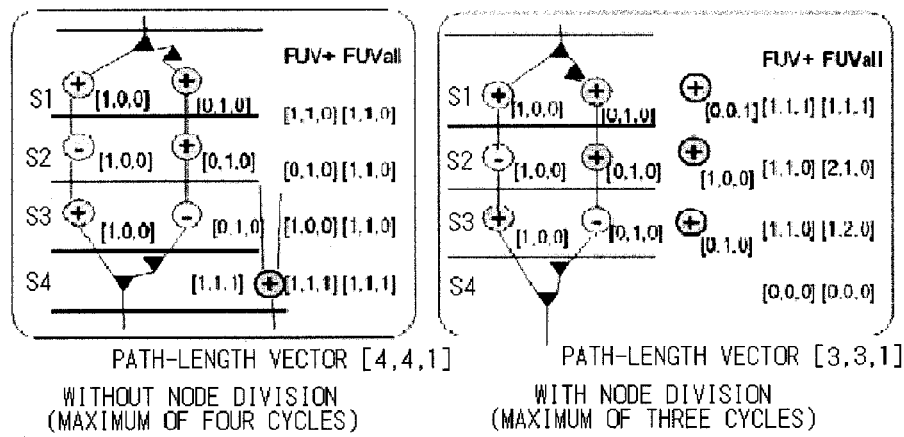
FIGS. 9A, 9B and 9C are diagrams useful in describing an example of operation-node division.

The modes for carrying out the present invention and a specific examples thereof will now be described.

<Generalized Condition Vector>

The condition vector ACV is capable of taking into consideration implicit mutual exclusiveness based upon data dependency and dynamic mutual exclusiveness in speculative execution. However, problems arise in the handling of two cases as limitations when expressing a conditional branch by a vector.

The first is handling of speculative execution among a plurality of conditional operations in nested conditional branches. Until now, consideration has been given mainly to speculative execution of the kind in which the operation of a THEN clause or ELSE clause of a branch is scheduled earlier than a conditional branch operation.

(A) However, it is not possible to accurately represent mutual exclusiveness between operations when speculative execution of the kind in which a conditional branch operation inside nested conditional branches is scheduled earlier than an outside conditional branch operation is carried out.

(B) A case where multiple conditional statements are arrayed sequentially (in parallel) in a branch of nested conditional statements cannot be expressed explicitly.

Accordingly, the present invention solves these problems of the ACV and introduces a generalized condition vector (GCV) that makes it possible to represent speculative execution relating to any type of conditional branch.

<Out-of-Order Execution of Conditional Operations Inside Nested Conditional Branch Statements>

Reference will be had to FIGS. 11A and 11B to describe out-of-order execution of conditional branch operations of nested conditional branch statements, and representation thereof by condition vectors. In FIGS. 11A and 11B, commas between the vector components are omitted from the form of expression. For example, [1,0,0] is expressed as [100]. Because of space considerations, and where there will be no possibility of misunderstanding, commas in the vectors illustrated in the drawings may be omitted.

The result of scheduling only the conditional operations (a*b<c))/*c1*/, (b>c))/*c2*/ of the operation described in 1) of FIG. 11A is illustrated in 2) and 3) of FIG. 11A.

In FIG. 11, 2) is in-order execution of the behavioral description.

In 3) of FIG. 11A, the inner conditional operation (b>c))/*c2*/ is decided before the outside conditional operation (a*b<c))/*c1*/ (this is out-of-order execution). In this case, at the position of control step 3, the inside condition c2 is resolved but the outside condition c1 is unresolved. In a case where a conditional operation is as shown here, the mutual exclusiveness of the operation of the branch cannot be represented at all with the active condition vector ACV.

The ACV and GCV in each of control steps 1, 2 and 3 are illustrated in 1) of FIG. 11A.

At control step 1, all of the conditions (c1, c2) are resolved.

At control step 2, the outside condition c1 is resolved and only the inside condition c2 is unresolved.

These ACVs are as illustrated in 1) of FIG. 11A and indicate conditional mutual exclusiveness precisely. For example, in the case where c1 is resolved and c2 unresolved, the operation [1,0,0] on the third line and the operation [0,1,1] on the fifth line, the mutual exclusiveness can be decided because c1 has been resolved. The vector also represents the mutual exclusiveness correctly.

Conversely, the addition operations on the fifth and sixth lines are mutually exclusive in terms of the behavioral description, but the condition c2 is unresolved and therefore this is not conditional mutual exclusiveness.

The ACVs are [0,1,1] and [0,1,1] for both operations and the fact that there is no conditional mutual exclusiveness can be expressed correctly. Of course, the necessary number of arithmetic units also can be expressed correctly.

On the other hand, according to the condition of control step 3, the ACVs all become [1,1,1], as illustrated in FIGS. 11A and 11B.

In the computation of ACV, the bitwise logical OR between the ECVs of the unresolved conditional operations among the related conditional operations is taken. In this case, therefore, the bitwise logical ORs involving [1,1,1], which is the ECV of c1, all become [1,1,1].

In other words, the state in which the inner conditional operation c2 is resolved cannot be expressed.

That is, since the outside condition c1 is unresolved, the operation on the third line and the operation on the fifth line (or sixth line) have no conditional mutual exclusiveness (arithmetic units cannot be shared). However, c2 has been resolved and therefore the operations on the fifth and sixth lines have conditional mutual exclusiveness.

Thus, in a case where an outside condition is unresolved, the ACV cannot express satisfactorily whether an inside conditional branch is resolved or not.

In order to solve this problem, the present invention introduces a generalized condition vector (GCV), which is an entirely novel concept.

The GCV is not simple vector representation and has "valid bits" in consecutive components in one portion of the vector.

In 1) of FIG. 11A, valid bits are underlined.

A valid bit is set in a case where an outside conditional operation is unresolved and, moreover, an inner conditional operation is resolved, and the portion where it is set is the bit at a position where a component of the ECV of the inner side resolved conditional operation is "1".

In this example, the ECV of the inside condition c2 (if (b>c)) is [0,1,1], and the portions where the components are "1", namely the second and third bits, are the valid bits.

The "1" components of the ECV (the same as BCV) of the conditional operation are always consecutive in one location, according to the definition, and therefore the valid bits also are a zone in which they are consecutive in one location. A condition vector having valid bits is referred to as the "GVC".

With the GCV, the decision of conditional mutual exclusiveness of an operation is such that it is judged that there is a mutual exclusiveness if there is no "1" in identical components between valid bits. In the decision of the mutual exclusiveness, bits other than valid bits are assumed to be 0.

In the GCV, in a case where valid bits do not overlap, decision may be done as with ordinary condition vectors.

The details of a method of calculating the necessary number of arithmetic units using a GCV will be described later.

Result of scheduling is illustrated in FIGS. 11A and 11B with the constraint that there is a single adder in the behavioral description at 1) in FIG. 11A, which utilizes precise conditional mutual exclusiveness of the GVC.

In FIG. 11A shows a scheduling result utilizing ACV, and 11B shows the scheduling result utilizing GCV.

In FIGS. 11A and 11B, the valid bits of the GCV are utilized in a state in which outside condition c1 is unresolved and inside condition c2 resolved at control step S2.

The ACV and GCV of this control step are the ACV and GCV of a portion of control step 3 in 1) of FIG. 11A.

In FIG. 11A, the ACV of node n1 (addition "s+u") (the ECV is [0,1,0]) at control step S2 is [1,1,1], and therefore the adder cannot be shared in any other addition.

On the other hand, according to the GVC in FIG. 11B, the GCV of node n1 (addition "s+u") at control step S2 is [1,1,0], and the GVC of node n2 (addition "x+u") in the CDFG is made [1,0,1].

Since the GCV [1,1,0] of node n1 and the GCV [1,0,1] of node 2 do not have a "1" in the same components between the valid bits, these are mutually exclusive and one adder can be shared.

This means that the addition operations (nodes) n1 and n2 can be scheduled to control step S2.

Accordingly, the necessary numbers of cycles overall are a maximum of four and a maximum of three in FIGS. 11A and 11B, respectively.

The necessary number of cycles differs depending upon whether or not mutually exclusiveness of nodes n1 and n2 can be extracted and, hence, whether or not the two addition operations have been allocated to control step S2 in such a manner that one adder is shared.

In view of the original behavioral description in 1) of FIG. 11A, operation n1 and operation n2 (the initial addition "x+u" on the sixth line) are shared in a state in which c1 is unresolved and c2 is resolved at the control step S2 in FIG. 11B.

In consideration of the above, such sharing of an arithmetic unit is difficult to discover systematically (using ACV) by code motion (speculative execution among multiple conditional operations in nested conditional branches).

The scheduling algorithm of the present invention performs scheduling efficiently upon taking such mutual exclusiveness of a GVC into account globally (in terms of the contribution to the whole).

<Method of Computing a Generalized Condition Vector GCV>

Described next will be a method of computing a GCV in a case where operations of nested conditional statements are executed out of order.

A GCV can express parallel conditional statements in a branch also in the same format.

FIG. 12 illustrates GCV values in a case where only some conditional operations are unresolved with respect to a certain behavioral description:

```
        if (a)
          if (b)
            if (c)
              if (d)         (1)
              else           (2)
            else             (3)
          else               (4)
        else if (e)          (5)
          else               (6)
```

In FIG. 12, "a: not" signifies that condition "a" is unresolved.

In FIG. 12, "b: done" signifies that condition "a" is resolved. In other words, in the example of FIG. 12, conditions a, c are unresolved and conditions b, d, e are resolved.

In FIG. 12, vectors indicated in the [ ] on the second line in the upper section of the behavioral description (the vectors below a: not, b: done, c: not, d: done) indicate the GCVs of the conditional operations. The vectors indicated in the ( ) on the third line in the upper section of the behavioral description indicate the ECVs of the conditional operations.

Condition e is resolved and indicates ECV: (000 11), GCV: 1111 11] on the lowermost line.

The column of ECVs on the right side of FIG. 12 indicates ECVs having operations described at the positions of leaves of the behavioral description. These are equivalent to the values of ACVs and GCVs that prevail when all of the conditions a, b, c, d, e are resolved (when the conditional operations have been scheduled to control steps earlier than the target operation).

On the other hand, in the case where conditions a, c are unresolved, as in FIG. 12, conditional operation a located on the outermost is unresolved. Therefore, the ACVs of all operations become the bitwise logical ORs between [1,1,1,1, 1,1], which are the ECVs of the conditional operation on the outermost contour. The result is [1,1,1,1,1,1].

On the other hand, a GCV is capable of accurately indicating mutual exclusiveness obtained solely by the resolved conditions b, d, as indicated by the column of GCVs in FIG. 12.

The ECV of the operation (referred to as "operation 1") at leaf (1) of the behavioral description is (1,0,0,0,0,0). The space inside the vector in FIG. 12 is merely for the purpose of making it easier to see the boundary of the conditional branch on the outermost. Commas between components are omitted.

Since the values of the ACV of operation 1 are obtained by taking the bitwise logical OR between the ECVs ([1,1,1,1,1, 1] and [1,1,1,0,0,0]) of the unresolved conditions a and c, we have [1,1,1,1,1,1]. Mutual exclusiveness based upon conditions b, d is not being utilized.

The GCV of operation 1 for which the bitwise logical OR with the ECV of the unresolved conditional operation is taken, is same as the ACV. However, this bitwise logical OR is masked (guarded) by the ECV of the inside resolved condition. A condition vector of an inside resolved conditional operation is referred to as a "guard vector".

The GCV of operation 1 is calculated in order from the inside condition as shown below.

First, since condition d has been resolved, (1,1,0,0,0,0), which is the ECV of condition d, is adopted as the guard vector.

Since the next outside condition c is unresolved, the bitwise logical OR between the ECV (1,0,0,0,0,0) of the leaf of operation 1 and the ECV (1,1,1,0,0,0) of condition c is taken with masking (guarding) by the guard vector (1,1,0,0,0,0) of condition d, and the result is [1,0,1,0,0,0]. The bitwise logical OR is taken between the vector (0,0,1,0,0,0), which has been obtained by masking the ECV (1,1,1,0,0,0) of condition c by the guard vector, and ECV (1,0,0,0,0,0), and the GCV [1,0, 1,0,0,0] is obtained. This can be represented as follows as the expression of the bitwise operation between vectors:

ECV (leaf of operation 1)|{(~ECV (condition d)) & ECV (condition c)} where ~, | and & denote a bit inversion operation, a bitwise logical OR and a bitwise logical AND, respectively.

The next condition b is resolved and the next condition a after that is unresolved. Therefore, in a manner similar to that above, the bitwise logical OR is taken between [1,0,1,0,0,0] and the ECV (1,1,1,1,1,1) of a under the guard condition (1,1,1,1,0,0], whereupon [1,0,1,0,1,1] is obtained.

The guarded portions (the 1 bits in the components of the guard vector) are valid bits. In a case where the guard is applied two or more times, the initial guard condition (the guard condition of the short bit length) is adopted as a valid bit.

In the GCV, valid bits are underlined. In implementation with a program, the valid bits are held by bit starting position and bit width. In other words, the GCV holds the bits as two structures, namely ordinary condition vector representation and valid bit representation. For example, [1,0,1,0,1,1] is expressed by the vector representation [1,0,1,0,1,1] and by the valid bit representation (0:2). Vector representation is by ordinary words of the processor, and bitwise logical OR and bitwise logical AND, etc., can be executed by a single clock instruction. This makes high-speed processing possible.

The procedure of calculation of GCV of operation 1:

$$GCV = ECV(\text{operation 1}) | (''ECV(\text{condition } d) \&$$
$$ECV(c)) | (''ECV(b) \& ECV(a))$$
$$= (1000\,00) | (''1100\,00) \& (1110\,00)) |$$
$$(''(1111\,00) \& (111\,11))$$
$$= [1\underline{01}0\,11]$$

where
ECV(x) is the ECV of operation x;
~ denotes a bit inversion operation;
| denotes a bitwise logical OR; and
& denotes a bitwise logical AND.

Other operations can be computed in a similar manner. First, the GCV of the operation (operation 3) in (3) of FIG. 12 becomes (1110 00) owing to "ECV (operation 3):(0010 00)|ECV(c):(1110 00)" because condition c is unresolved.

Next, under the guard condition b, the bitwise logical OR with the ECV of the unresolved condition a is taken. Therefore, we have [1 1 1 0 1 1] from "(1 1 1 0 0 0)|(~ECV(b) (1 1 1 1 0 0)) & ECV(a):[1 1 1 1 1 1].

The condition d is unrelated to the computation of the GCV of operation 3. The reason is that this is a conditional branch farther inside than operation 3 and has no influence upon the mutual exclusiveness of operation 3. Operation 5 at the position of leaf (5) is guarded by the guard condition (0 0 0 1 1) and bit-ORed with the unresolved condition a. Hence, [1,1,1,1,0,0] is obtained.

<Determination of Mutual Exclusiveness>

With regard to conditional mutual exclusiveness, if valid bits overlap in GCVs, an exclusiveness check is conducted in the conventional manner using only the valid bits. That is, a case where there is no "1" at identical bits positions indicates mutual exclusiveness, and a case where there is a "1" at identical bit positions indicates non-mutual exclusiveness.

In a case where bit lengths of valid bits are different, computation is performed using the longer bit length. In actuality, however, the decision result of the mutual exclusiveness is the same even if computation is performed using the short bit length.

In a case where valid-bit positions do not overlap, it will suffice to check whether "1"s do not overlap at identical positions, in a manner similar to the ACV.

For example, in FIG. 12, (1) and (3) are not mutually exclusive ([1 0 1 0 1 1] and [1 1 1 0 1 1]) because condition c is unresolved (or undetermined).

In FIG. 12, (1) and (4) are resolved and, hence, they are mutually exclusive ([1 0 1 0 1 1] and [0 0 0 1 1 1]).

The GCV computation method (at the time of out-of-order execution of a conditional operation) is given by the following procedure:

Step 1:
guard condition vector=[0]; (all components are "0")
Step 2: The following for loop:

```
for (from inside condition test operation ci to outside
conditional operation)  {
  GCV(n) = ECV(n);
  if   (ci == resolved)
  guard vector = ECV(ci); set valid bits;
  if   (ci == unresolved)
  GCV(n) = GCV(ni) | (~guard vector & ECV(ci));
}
``` where
n is a certain operation node;
ci indicates a condition of order higher than that of its own conditional branch to which the node n belongs;
GCV(n) is the GCV of n; and
ECV(n) indicates the ECV of c.

The GCVs at positions (1) to (6), which are leaves of the behavioral description of FIG. 12, are illustrated in FIG. 13 with respect to various combinations of conditional operations that are "unresolved" and "resolved". The column at the left end associated with the upper lines of the table indicates the names of the conditional operations and the ECVs thereof. Here "done" indicates that the condition has been resolved, and "not" indicates that the condition is unresolved. Further, "guard", which is a resolved condition, indicates a guard condition (the guard vector is the ECV of this guard condition). The lower lines (1) to (6) represent the GCVs at the respective leaf positions for every condition in the columns.

<Calculation of the Necessary Number of Arithmetic Units>

Described next will be a method of extending, for a GCV, a method of calculating the necessary number of arithmetic units using ACV. The method of calculating the necessary number of arithmetic units using ACV finds a vector sum FUV of the ACVs of all operations allocated to a certain type of arithmetic unit and finds the largest component thereof as the necessary number of arithmetic units.

However, since a GCV has valid bits, the components are not perfectly independent and the method of calculation requires revision. A method of calculating an FUV using a GCV will be illustrated below.

Method of calculating FUV and number of arithmetic units with respect to GCV:

A set S of GCVs having overlapping valid bits is created.
Vectors not having valid bits are all placed in one set S0.

```
for (with regard to each set S) {
for (GCV in the set S) {
FUV(s) = FUV(s) + GCV;
(where + indicates vector addition of GCVs)
}
}
FUV = ΣFUV (ordinary vector addition of FUVs of all S and S0)
(where + in FUV(s) + GCV indicates vector addition of GCVs)
```

Vector addition is performed adopting components other than valid bits as "0".

After addition, the value of the largest component among the valid bits is set to other than a valid bit portion.

This procedure will be described using the example of FIG. 12. Assume that numbers of additions identical with the respective numerals inside ( ) exist at leaves (1) to (6) in FIG. 12. In other words, assume that there is one addition at leaf (1), two additions at leaf (2) and six additions at leaf (6).

In this case, the value of FUV obtained by adding the GCVs is obtained. Since the number of additions is just the number of the respective leaf, the FUVs among the respective leaves are indicated in the section on the right side of FIG. 12.

For example, at leaf (2) in FIG. 12, $$[0, 1, 1, 0, 1, 1] + [0, 1, 1, 0, 1, 1]$$
$$\rightarrow [0, 1, 0, 0, 0, 0] + [0, 1, 0, 0, 0, 0]$$
$$= [0, 2, 0, 0, 0, 0] \text{ (addition with bits other than valid bits made 0)}$$
$$\rightarrow [0, 2, 2, 2, 2, 2] \text{ (bits other than valid bits made maximum value)}$$

If addition is performed similarly with regard to other leaves (1) and (3) to (6), the values in the FUV column on the right side of FIG. 12 are obtained.

Next, these are added. The result of adding the upper four lines of overlapping valid bits [the FUVs of leaves (1) to (4)] is as follows if the foregoing is performed in a similar manner:

$$[\underline{1, 0}, 1, 0, 1, 1] + [\underline{0, 2}, 2, 2, 2, 2] + [\underline{3, 3, 3, 0}, 3, 3] + [\underline{0, 0, 0, 0}, 4, 4, 4] =$$

$$[4, 5, 3, 4, 5, 5].$$

With regard to one more set, the results of adding the lower two lines [the FUVs of leaves (5) and (6)] is as follows:

$$[5, 5, 5, 5, \underline{5, 0}] + [6, 6, 6, 6, \underline{0, 6}] = [6, 6, 6, 6, \underline{5, 6}].$$

Finally, since ordinary vector addition will suffice for the sum of the GVCs not having overlapping valid bits, the final FUV+ (FUV of adders) is as follows:

$$[\underline{4, 5, 3, 4}, 5, 5] + [6, 6, 6, 6, \underline{5, 6}] = [10, 11, 9, 10, 10, 11].$$

Accordingly, 11, which is the largest component, is the minimum necessary number of adders in this case.

In this case, if computation of FUV using ACV is performed, the ACV becomes all [1]'s. Therefore, the FUV becomes [21,21,21,21,21,21] and 21 adders are required.

This means that in a case where only some of nested conditional branches have been resolved, applying the conditional mutual exclusiveness thereof precisely makes it possible to approximately halve the necessary number of arithmetic units (11 as opposed to 21). For purpose of reference, the FUV in a case where all conditional branches have been resolved is [1,2,3,4,5,6], and therefore a minimum of six adders is required.

<Representation of Parallel Conditional Branches>

One more inadequacy of the representation in an ACV is a case where multiple parallel conditional branch statements are arranged in a conditional branch.

Figure 14A:
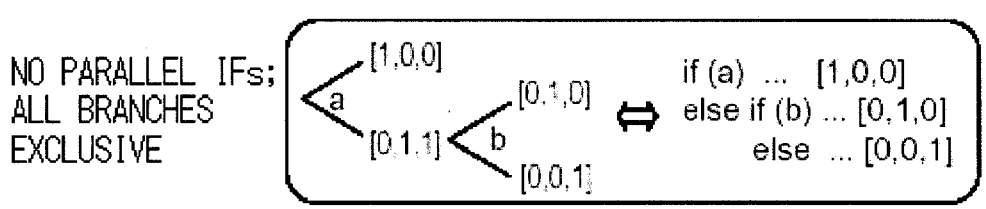
FIGS. 14A, 14B and 14C are diagrams useful in describing handling by ACV of parallel IF statements inside a nested branch.

In a case where there are no parallel IFs, all branches are mutually exclusive, as illustrated in FIG. 14A.

With ACV, however, parallel IF statements in a nest cannot be represented. For example, in the following behavioral description of parallel IFs in a nest:

--- if (a)
else if (b)
else
if (c)
else

Figure 14B:
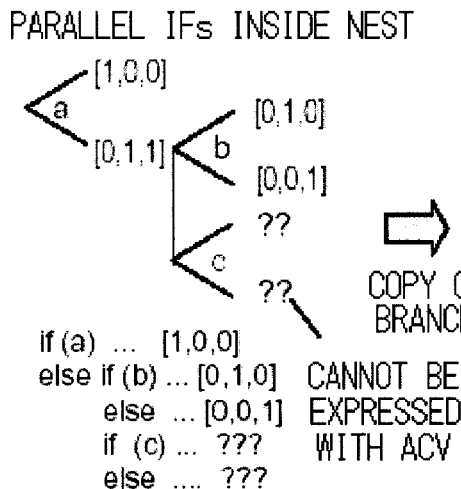

--- the "if (c) else" of the parallel IFs cannot be represented (this is indicated by ?? in FIG. 14B), as illustrated in FIG. 14B.

Figure 14C:
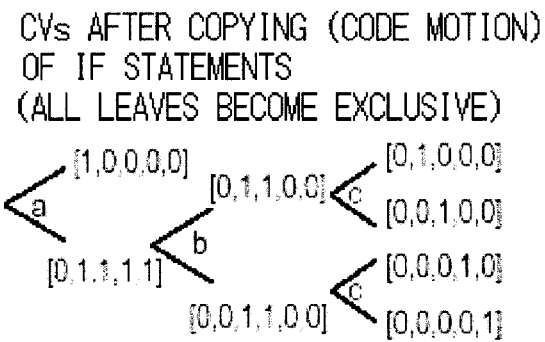

Accordingly, the IF statements are subjected to code motion and all leaf nodes are assumed to be mutually exclusive, as indicated in FIG. 14C.

However, a problem, namely an increase in code motion and number of branches (an increase in amount of computation) arises. This will be described in further detail. A parallel IF statement can be represented using valid bits (two bits), as illustrated in FIG. 15A. A parallel IF statements are the representation equivalent to speculative execution in a case where a condition x is unresolved, as illustrated in FIGS. 15C and 15D.

First, a one-hot code is attached to each leaf node (the number of vector components is five in this case), as illustrated in FIG. 15D. Here [1,0,0,0,0], [0,1,0,0,0], [0,0,1,0,0], [0,0,0,1,0] and [0,0,0,0,1] are allocated to the THEN clause node (1) of condition a, the THEN clause node (2) of condition b, the ELSE clause node (3) of condition b, the THEN clause node (4) of condition c, the THEN clause node (4) of condition c and the ELSE clause node (5) of condition c, respectively.

Next, in the portion that is the parallel IF statements, a zone that is distinguished by the conditional operation nearest its own node is adopted as valid bits. At nodes (2) and (3), second and third bits for which mutual exclusiveness can be decided by condition b become valid bits based upon condition b. At nodes (4) and (5), fourth and fifth bits for which mutual exclusiveness can be decided by condition c become valid bits based upon condition c. Here 1 and {2 or 3}, 1 and 6, 1 and {4 or 5}, 2 and 3, 4 and 5 are mutually exclusive. Further, 2 and 4, 2 and 5, 6 and 2, etc., are not mutually exclusive. That is, in a case where condition x is unresolved, mutual exclusiveness between conditional branches b and c vanishes. This point will be described below in detail.

In FIG. 16A illustrates an example in which three conditional statements (b, c, d) have been placed in THEN clauses of condition a (if (a)). With regard to the basic condition vector BCV, it is required that each of the leaves be mutually exclusive. Each leaf is mutually exclusive. Therefore, when a one-hot code is applied to each leaf, the property that a mutually exclusive operation not have "1" at mutually identical positions is satisfied.

However, in the case of FIG. 15A, the then clause and else clause of "if (b)" are exclusive but there is no mutually exclusive relationship whatsoever between "if (b)" and "if (c)", "if (d)"".

Accordingly, in order to represent a behavioral description having such a control structure by BCV, it is required that the conditional branch be equivalently converted to a format (all leaves mutually exclusive) capable of being represented by BCV, as illustrated in FIG. 16B.

This conversion copies if (d)" to both the then clause and else clause of "if (c)" and to the then clause and else clause of "if(b)".

Owing to this conversion (tree copy), all leaves become mutually exclusive and FIG. 16B, which is a behavioral description equivalent to (a) of FIG. 16, is obtained.

With this method, however, the number of leaves after the conversion increases as an exponential power of the number of conditional branches arranged in parallel. When there is more than a certain number of parallel conditional statements, therefore, the number of dimensions of the condition vector becomes very large. This method is therefore unrealistic. Further, the number of operation nodes to undergo scheduling increases exponentially. As a consequence, the computation efficiency of the scheduling processing declines.

The BCVs of leaves of the behavioral description (tree copy) of FIG. 16B are indicated on the right side of FIG. 16B.

In order to reduce the number of branches, there is a method of dividing a conditional branch by top level.

In FIG. 16C, a BCV has been resolved for every top-level conditional statement. In (c) of FIG. 16, therefore, three independent BCVs are described.

However, this tree division is not strictly an equivalent conversion and there are instances where there is a deleterious effect upon number of cycles of scheduling results and necessary number of arithmetic units.

The GCV improves upon these problems and directly represents parallel conditional statements within a branch. It is of particular interest that parallel conditional statements in a branch can be expressed using the "valid bits" introduced in order to indicate speculative execution of nested conditionals.

<Method of Computing GCVs of Parallel Conditional Statements in a Branch>

The GCVs are illustrated on the right side of the behavioral description in FIG. 16A. A method of computing GCVs in a behavioral description that includes parallel conditional branch statements in a branch is as set forth below. The number of dimensions is the number of leaves, similar to the BCV.

First, a one-hot code is attached to each leaf node (in this case, the number of vector components is seven). [1000000] to [0000001] are allocated from the then clauses of condition b to the else clauses of condition a.

Next, in the portion that is the parallel conditional statements, a zone that can be distinguished by the conditional operation nearest its own node is adopted as valid bits.

For example, two higher-order bits for which mutual exclusiveness can be resolved by condition b become valid bits based upon condition b. Valid bits based upon conditions c and d are as illustrated in the drawings.

Next, components of valid bits of parallel conditions statements other than its own are all made "1". The GCV of an operation other than a leaf is the bitwise logical OR of the GCVs of its own succeeding operations. It should be noted that valid bits also are obtained by taking the OR of valid bits of succeeding operations.

Figures 18A, 18B:
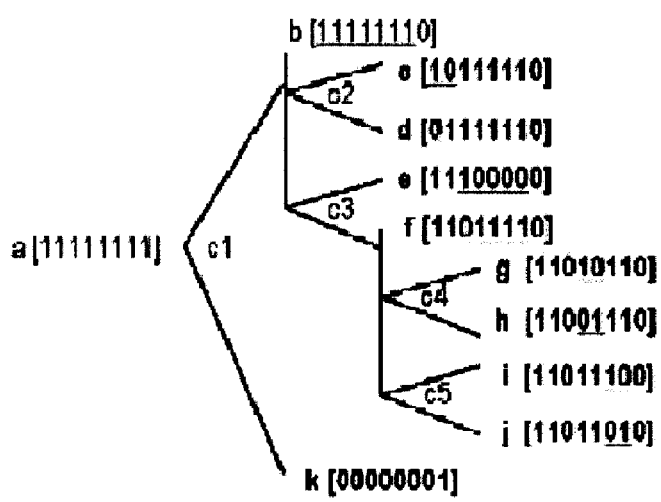
FIGS. 18A and 18B are diagrams illustrating an example of parallel conditional statements in a branch and the corresponding GCVs.

A more general example of operation and GCVs are illustrated in FIGS. 18A and 18B. The respective GCVs can be calculated by the method illustrated above. With the GCVs obtained here, the method of determining mutual exclusiveness and calculating the necessary number of arithmetic units discussed thus far can all be applied as is.

The GCVs at the time of parallel conditional statements in a branch and at the time of out-of-order execution of a conditional operations are represented by the same format. What must be noted is that in the case of the latter (out-of-order execution of a conditional operations), valid bits appear only in a case where some of the conditional operations are unresolved, whereas in the case of the former (parallel conditional statement in a branch), valid bits exist even if all conditions have been resolved.

The above-described computation method can be utilized as is even in a case where some conditions in parallel conditional statements in a branch are unresolved.

For example, in a case where condition b is unresolved in FIG. 16A, it will suffice to take the bitwise logical OR with the ECV (1,1,0,0,0,0,0) of condition b.

In a case where only condition a is unresolved, it will suffice to take b, c and d as the guard conditions. As a result, the leading GCV becomes [1011111] and the final GCV becomes [1111111], by way of example.

Thus, even if parallel conditional statements in a branch are executed out of order, the values of GCVs can be calculated without contradiction.

<Consistency of GCVs of Out-of-Order Execution of Parallel Conditional States in a Branch and Conditional Operations>

An example of GCVs of parallel branch statements (parallel IF statements) in a branch is illustrated in FIG. 17A, and GCVs in a case where a certain condition (b) is unresolved in speculative execution of a conditional in a nested conditional branch is illustrated in FIG. 17B.

The parallel branch statements in a branch are as follows:

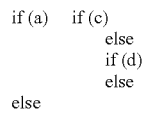

The behavioral description of speculative execution of a conditional in a nested conditional branch is as follows:

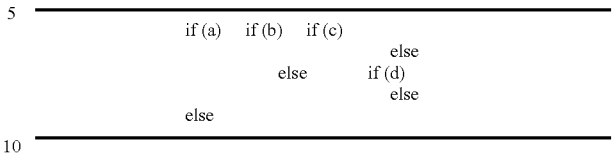

Both GCVs coincide perfectly, as illustrated in FIG. 17A and 17B. This suggests that these two are entirely the same when conditional mutual exclusiveness is considered.

The reason why this is true will be considered. It will be understood from FIG. 17B that in a case where condition b is unresolved, conditional mutual exclusiveness between the two conditions c and d in the succeeding conditional statement of the condition b vanishes. In other words, this is equivalent to the fact that two IF statements [if(c), if(d)] exist in parallel. It will be understood, therefore, that in a case where condition b is unresolved, these are identical in the meanings of the parallel conditional statements in the branch and the conditional mutual exclusiveness in FIG. 17A are identical. The consideration above can be readily extended to a general case.

In view of the foregoing, all cases of mutual exclusiveness and speculative execution owing to one top-level conditional branch can be represented systematically or in a unified manner.

Next, it will be illustrated that top-level conditional branches also can be represented systematically and, and it will be shown that a GCV is capable of representing all conditional mutual exclusiveness and speculative executions.

<Top-Level Conditional Branch>

The above-described method of representing parallel conditional statements in a nested branch by GCVs having valid bits is applicable also to conditional branch statements arrayed in a top level.

Even if a SWITCH statement exists in the top level and the condition of the SWITCH statement is considered to be unresolved, it will be understood that the representation by a GDV having valid bits is possible.

In FIG. 19, an example in which two top-level conditional branches T1 and T2 are placed is expressed by GCVs (a case in which these are placed in the body of a loop also is considered in the same way).

When GCVs are applied to such top-level conditional branches, therefore, valid bits are attached to vectors of the portions of the top-level branches, and the others all become "1". Very long GCVs result, and this unrealistic. With program installation, the format becomes one having the associated branch names and GCVs of every top-level conditional branch.

What is important is that operations belonging to different top-level conditional branches are considered to have virtually unified GCVs.

Scheduling is not performed for every top-level conditional branch. Operation nodes belonging to different top-level conditional branches can be scheduled in any order.

That is, it is possible for operations belonging to different top-level conditional statements to be handled in the manner of an operation in one basic block at the time of scheduling. These are described also a with a scheduling algorithm.

<Scheduling Method>

A scheduling method utilizing a condition vector (GCV) given to an operation node of a CDFG will be described. This is based upon list scheduling applicable also to large-scale circuits and is referred to as Condition-Vector-Based List Scheduling (CVLS). The scheduling method is not local scheduling inside a basic block but is an optimizing global scheduling method that goes beyond control dependency (goes beyond the basic block). The features of the CVLS method as a global scheduling method are the following two features:

1) All types of speculative execution can be judged and applied from the global point of view, and the scheduling processing itself is efficient.

2) Optimization of all paths and not just the longest path is attempted.

It is possible to deal with arithmetic-unit constraints and time constraints, and operation in which both of these are mixed is necessary. However, an arithmetic-resource-constraint scheduling technique, in which scheduling is performed with the shortest cycle under an arithmetic-unit constraint, will be discussed.

<Priority Function>

With list scheduling, data dependency is analyzed, a set that has become capable of being scheduled to a certain control step (the set will be referred to as an "allocatable list" or "remedy list" below) is created, and a candidate for scheduling is created from the set based upon a certain priority function. Whether an initially scheduling result is good or bad is decided based upon the suitability of the priority function. A typical priority function of local list scheduling with respect to a basic block is the length (number of stages of arithmetic units) from the terminal node (referred to as the END node) of the CDFG to this node. Although it is so arranged that the priority function can be changed over optionally or depending upon the nature of the behavioral description, basically the distance from the END node is utilized in a similar manner. However, an improvement is achieved in that scheduling is global scheduling and is performed across a plurality of basic blocks, and in that the necessity of taking actual delay of arithmetic units (the chain effect of operations) into account, as well as time constraints, are dealt with.

(a) Distance with attached probability

In the CVLS, scheduling across a plurality of basic blocks is performed utilizing a method of calculating necessary number of arithmetic units of a condition vector. Simple distance from the END node, therefore, cannot be utilized as the priority function. The reason is that distance is not uniquely resolved in a case where there is a conditional branch.

According to the present invention, it is so arranged that two priority functions of maximum distance and probability distance can be selected. In a default, probability distance is utilized and minimization of all paths is performed.

Further, distance uses actual delay of an operation and not the number of stages of operations.

Probability distance is calculated by the he average, with the probability of the branch being taken, of distance from END nodes of the respective branches. A path having a higher probability of the branch being taken is optimized, and optimization of other short paths also can be included in an evaluation function. The proposed priority function is resolved by the inner product of a probability vector and distance vector, as will be illustrated below. In a case where there is no conditional branch, the priority function is equal to the maximum length to the END node.

Probability vector p: probability of occurrence of each bit (i.e., condition of the leaf) of conditional branch condition vector to which operation node n belongs.

In a case where a profile for which a simulation has been executed can be utilized, the probability of occurrence is utilized. In a case where a profile cannot be utilized, the probability of occurrence of each bit is calculated from the probability of each condition being resolved. For example, in a case where the establishment probabilities of a, b, c in the following behavioral description are each 50%, the occurrence probabilities of the respective bits are [¼, ⅛, ⅛, ½]:

| | |
|---|---|
| if (a) if (b) x; | [1,0,0,0] |
| else if (c) else y; | [0,1,0,0] |
| else z; | [0,0,1,0] |
| else | [0,0,0,1] |

(b) Distance vector

The distance vector is the sum of ECVs of operations that exist in a path from operation node n to the END mode. In actuality, ECVs are added in order from the END node toward information. In case of fan-out or a JOIN node, the maximum value of components at the same positions is taken. By thus passing through the flow one time, the distance vectors of all nodes of the CDFG are found. In the case of a conditional node, the condition lines from a JOIN node or FORK node are also included in the path. In a case where there is a time constraint imposed between nodes (e.g., zero cycles between a certain operation and another certain operation), the time constraint also is considered in the calculation of the distance vector. Specifically, the line of the time constraint is calculated as the distance of this cycle portion.

In the description thus far, the distance vector is taken as the sum of the ECVs, i.e., as the number of operations traversed. However, delay time of each operation is utilized in the actual computation of the distance vector. For example, in a case where the delay of an operation of an ECV of [1,0,1] is 4 ns, [1,0,1] is added to the distance vector. Instead, [4,0,4] is added. The time constraint given by the number of cycles is replaced by actual time by utilizing the clock period.

The priority function is the sum total of the results of taking the inner product of the probability vector and distance vector for every conditional branch. It is resolved as set forth below.

(c) Priority function pf(n)

$$pf(n)=\Sigma T(p,d)=\Sigma T \Sigma T_i(p_i * d_i)$$

where p is a probability vector, d is a distance vector, pi, di represent components of each vector, T is a set of conditional branches from a node to an END node, and is an index indicating each component of the vector.

It is required that the priority function take into consideration the relative relationship between the clock period and the delay of an arithmetic unit. The purpose of the arithmetic-unit constraint scheduling algorithm of this embodiment is to minimize the average necessary number of steps.

(d) Object function:

"average necessary number of steps"=(path-length vector, probability vector)

Here the path-length vector is path length, of every leaf condition, calculated while skipping 0 components of FUVall. The probability vector is the occurrence probability of each leaf condition. The average necessary number of steps is the necessary number of cycles obtained by averaging path length with attachment of occurrence probability.

<Rescheduling of Operation Nodes>

A method of dividing nodes and allocating the scheduling positions of operation nodes randomly has been described. What is the key here is an approach that reduces the number of steps, i.e., increases the number of 0 components of FUVall, while adhering to the arithmetic-unit constraint. This approach itself is utilizable broadly in overall scheduling.

Even with the scheduling technique of the present invention, once scheduling has been completed, the scheduling positions of nodes are modified sequentially within the possible range regardless of whether or not node division is performed, and the necessary number of cycles is reduced. The method adopted is a sequential iterative improvement scheduling method after initial scheduling.

Figures 20A, 20B, 20C:
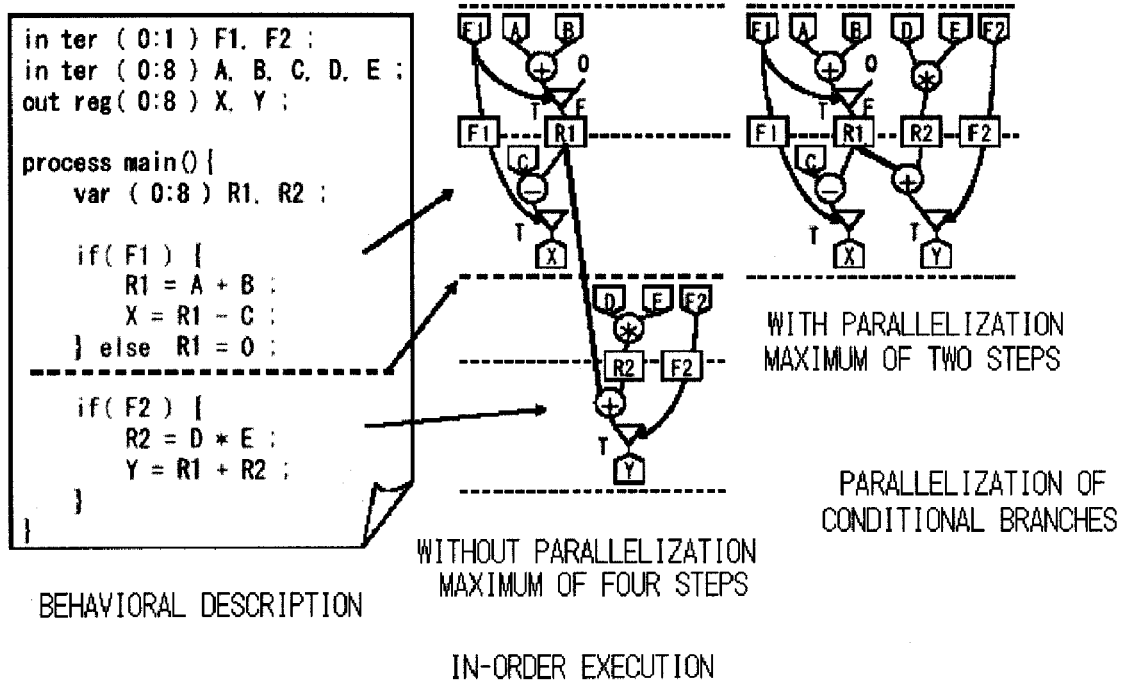
FIGS. 20A, 20B and 20C are diagrams illustrating an example of global speculative execution: speculative execution with respect to multiple conditional branches.

Next, an example of speculative execution ("global speculative execution") of the kind that parallelizes multiple conditional branches is illustrated in FIGS. 20A-20C. The behavioral description of FIG. 20C is a description example having two top-level conditional branches (IF statements) (description is in accordance with BDL language, which is obtained by extending C language).

The result of in-order scheduling of this behavioral description is illustrated in FIG. 20A. Although the number of cycles required for execution differs depending upon true/false of each of the conditions, four cycles are required in a case where both conditions are true.

In FIG. 20B illustrates a case where parallelization of these top-level conditional branches is allowed.

Although there is data dependency on variable R1 between the two IF statements, parallelization is possible and scheduling is possible in two cycles at most (even in a case where the two conditionals are true), as indicated at FIG. 20B, if the constraint of conditional dependency is removed.

In the example of FIG. 20B, it may be so arranged that each of the conditional statements undergoes local speculative execution and further undergoes this global speculative execution, as a matter of course.

It is believed that the present invention is the first to disclose a scheduling method of behavioral synthesis in which global speculative execution is handled explicitly as illustrated in FIG. 20B. This scheduling technique is believed to be the first disclosed in the field of compilers.

<Method of Parallelizing Multiple Conditional Branch Statements (Scheduling That is More Global)>

A method of performing global scheduling across basic blocks using condition vectors as opposed to local scheduling, which is scheduling within a basic block, has been discussed.

This is a method of performing various out-of-order executions with respect to one nested conditional branch.

A method of parallelizing multiple top-level conditional branches, as illustrated in FIGS. 21A and 21B, will be described. Unlike basic speculative execution, in which an operation within a branch is executed before the branch operation is resolved, parallelization does not require that an operation within a branch always be scheduled before the conditional operation; multiple conditional branches are parallelized. This is an important point.

Naturally, performing further parallelization upon carrying out speculative execution at each conditional branch is taken into consideration.

Out-of-order execution and speculative execution are used in a substantially equivalent sense. Accordingly, such global parallelization is referred to as global speculative execution even if local speculative execution is not carried out.

<Method of Parallelizing Multiple Conditional Branch Statements>

(a) Sequential parallelization based upon ACV

The operations in one top-level conditional statement (IF statement or SWITCH statement) are mutually exclusive, and sharing of arithmetic units is possible.

Further, the branch path executed one time is only one.

On the other hand, operations in different top-level conditional statements are not mutually conditional mutual exclusive and arithmetic units cannot be shared.

Further, in a case where top-level conditional statements are parallelized, a plurality of branch paths (the number of which is equal to the number of parallelized top-level conditional statements) are executed. Accordingly, the above-described method of generating control logic cannot be applied as is to one conditional branch.

An example of two top-level IF statements (CT1, CT2) is illustrated in FIG. 21A. Condition vectors (ACV) are applied to CT1, CT2. The GCV values are indicated below GCV. It is assumed that conditions C1, C2 and C3 have all been resolved. Consider that the two top-level IF statements of CT1 and CT2 are parallelized under the constraint of two adders and one subtractor. Although additions and subtractions within CT1 and CT2 are in a conditionally mutually exclusive relationship, there is no mutually exclusive relationship between the additions of T1 and T2. As a method of performing parallelization sequentially, if first branch CT1 is scheduled by the CVLS method, the remaining arithmetic units in each control step are computed and CT2 is scheduled next using this as a new arithmetic-unit constraint, then two conditional branches can be parallelized. Of course, scheduling is executed at this time in such a manner that the data dependency between CT1 and CT2 is satisfied. In FIG. 21, variable x has data dependence between branches.

In FIG. 21B, FUV+, FUV− are arithmetic-unit utilization-degree vectors of an adder and subtractor, respectively. In CT1, it will suffice if the largest values of the components of these vectors do not exceed 2 and 1, respectively.

Here R1 represents the number of remaining arithmetic units not used in each control step. Scheduling of CT2 is performed with R1 serving as the arithmetic-unit constraint. In other words, it will suffice if scheduling is performed in such a manner that the largest components of FUV+, FUV− do not exceed R1 in each control step. With this method, however, the order in which operations are scheduled is the order in which the conditional branch statements (switch statements) are described in the behavioral description, and the optimum nature clearly is lost. It should be noted that this method is a method proposed because the number of arithmetic units cannot be calculated between different top-level IF statements. A method improved by using GCV will be described next.

(b) Parallelization utilizing GCV

Consider that the above-described parallelization of the plurality of conditional branches is performed based upon the generalized condition vector GCV. If GCV is utilized, it is possible to calculate the necessary number of arithmetic units even between operations among a plurality of conditional branches. Therefore it is possible to perform scheduling in order of decreasing priority functions without being concerned with the associated conditional branch.

That is, control dependency of conditional branches is removed in every sense and parallelization is possible only with data dependency. In other words, in a case where this is viewed from the scheduler, operation nodes to which GCVs have been attached may be handled just as if all of them were in a basic block. Accordingly, various (local) scheduling algorithms developed for application to a basic block are applicable to global scheduling.

An improved method, using GCVs, of sequential parallelization that is based upon the ACVs is very simple, and basically FUV is merely computed based upon GCV utilizing GCV. GCV can be considered (virtually) in a unified manner in all top-level operations. Accordingly, if the necessary number of arithmetic units is calculated by the method of computing FUV based upon GCV, scheduling is possible in any order without relation to the associated conditional branch.

This will be described with reference to the example of FIGS. 21A and 21B. For example, assume that [1,0,1,1,1] of CT1 is allocated to control step S1 and that [1,1,1,0,0] and [1,1,0,1,1[ of CT2 is allocated to control step S1. At this time, FUV+ is obtained by [1,0,1,1,1]+[1,1,1,0,0]+[1,1,0,1,1], and therefore it will be understood that two adders are necessary owing to [1,0,1,1,1]+(1,1,1,1,1).

Next, even if addition [0,1,1,1,1] is allocated, the fact that the constraint of two adders is adhered to can be resolved immediately by similar computation. FUV+, FUV− based upon GCV are illustrated on the right side of (b) in FIG. 21.

Thus, by utilizing GCV, it is not necessary to be bound by the control structure and control dependency of the behavioral description, as by scheduling all operations of CT1 and then scheduling CT2, and it will suffice if all are scheduled similarly to one basic block utilizing the FUV based upon GCV, as described above.

From the above considerations, the CVLS method proposed by the present invention is thought to be an outstanding method through which parallelization can be performed without being constrained by control dependency of all types of conditional branches, in which probably all types of out-of-order operations can be implemented in a unified manner. It should be noted that scheduling having these properties has not been proposed as far as the inventor, who is a specialist in this field, knows.

<Generation of State Machine (FSM) for Control>

Figures 10A, 10B:
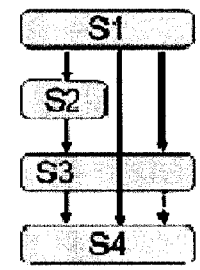
FIGS. 10A and 10B are diagrams useful in describing an example of generation of control logic.

Reference will be had to FIG. 10 to describe a method of generating control logic with respect to a simple conditional branch. With this method, however, dealing with a case where conditional branches are parallelized is not illustrated (this is not limited to a top-level conditional branch, and operation is similar also when multiple conditional branches within a branch are parallelized by GCV).

A method of generating control logic in a case where conditional branches have been parallelized will be described using the parallelized scheduling result described with reference to FIGS. 21A and 21B.

This method of generating control logic can be utilized in a manner similar to parallelization using GCV even if the scheduling method is sequential parallelization. If a control circuit is generated in such a manner that 0 of FUVall is skipped with respect to each of the conditional branches CT1, CT2 of FIGS. 21A and 21B, the state transitions shown in FIG. 22A are obtained.

If these two state transitions are synthesized as independent FSMs, operation will not be performed correctly. The reason is that the two state transitions are not independent and exhibit a dependent relationship.

1) There is data dependency between two branches.

2) Since the necessary number of arithmetic units differs between branches C1 and C2 in each control step, there is a combination of states that does not satisfy the arithmetic-unit constraint.

For example, in a case where CT1 makes a transition from step S1 to S2-1 and CT makes a transition from control step S1 to S3-2, data dependency also no longer satisfies the arithmetic-unit constraint.

In other words, it must be so arranged that the two state transitions are synchronized and always placed in the same control step.

Although there is also a method of creating and synchronizing a plurality of FSMs, many hardware resources become necessary. Therefore it will suffice if one FSM that implements two synchronous state transitions is generated.

In order to merge a plurality of synchronous state transitions into one FSM, it will suffice if a jump destination to which a jump is possible and the condition thereof are found in all branches of respective state transitions.

For instance, in the example of FIGS. 22A and 22B, consider finding these in order from those that make a transition to the nearest.

CT1 makes a transition to S2-1 at "c1'" ["c1'" is the complementary (inverse) value of c1]. CT2 does not have a transition to S2.

Accordingly, first logic that makes a transition to S2 at the condition "c1'" is generated. It will be understood that it will suffice if a transition is made to S3 in case of "c2*c3'" under condition other than this condition, and to the final state under conditions other than these conditions.

If the above-mentioned method of generating control logic is described in terms of GCV, state transitions of GCV nodes in which valid bits do not overlap are considered the above-mentioned parallel conditional branches and the above-mentioned transition generating rule is applied.

In other words, FUVall is found for every one having overlapping valid bits, and a state transition is found with regard to each one. The fact that valid bits overlap means that it belongs to the same conditional branch in the example cited above.

Next, it will suffice if each of the state transitions is merged to generate one FSM by the method described above. If the method of generating control logic illustrated in the above example is generalized, the procedure becomes as set forth below.

<Procedure for Generating Transition States in a Case Where Conditional Branches are Parallelized> present state=leading control step;

Step 1:

precond=1 (true)

The farthest transition destinations are obtained among the direct transition destinations from the "present state" of each branch (or each "set in which valid bits overlap" of GCV), and the nearest transition destination Jmax is found among these.

Step 2:

In all transition destinations from each branch, the nearest from Jmax are sorted in decreasing order of nearness and the result is placed in a transition-destination list Jlist.

Step 3:

A transition condition to the transition destination of Jlist is found. The condition of the same transition destination is extracted from the beginning of the Jlist, and the logical OR of the transition conditions is made C.

The transition condition of the synthesized state machine is COND=precond*C and the extracted jump destination is deleted from Jlist.

Step 4:

If Jlist is empty, the generation of transitions from the present state is terminated, the present state is made the next state and the procedure goes to step 1.

Else precond=precond*!COND is performed and the procedure goes to step 3.

(Here !COND is the negation of COND, namely a case other than the COND condition).

End:

In the example of FIGS. 22A and 22B, we have the following if the procedure above is described:

The state transitions from S1 of each conditional branch are as follows:

$CT1:$     if $(C1) \to S5$     -(1)
        else $\to S2$     -(2)
$CT2:$     if $(c2) \to S3$     -(3)
        else if $(c3) \to S3$     -(4)
        else $\to S5$     -(5)

Accordingly, if the above-described algorithm is applied, we have the following:

Jmax=S5
Jlist=[S2, S3]
The transition condition COND to S2 is !c1.
The transition condition to S3 is $(c2||!c2*c3)*!(!c1)$.
The transition condition to S5 is $!((c2||c3)*!(!c1))$.
The transition conditions from S1 of the synthesized FSM are as follows:

$S1:$ if $(!c1)$     $\to S2:$ if (2)
Else if $(c2||!c2*c3)$     $\to S3:$ $elseif(3, 4)$
    else     $\to S5:$ else Further, the state transitions from S2 and S3 are similarly obtained in the following manner:

$S2:$ if $(c2||!c2*c3)$     $\to S3$
       else     $\to S5$
$S3:$ if $(!c2*c3)$     $\to S4$
       else     $\to S5$
$S4:$     $\to S5$ <Scheduling Algorithm>

The basic flow of the overall behavioral synthesis is as set forth below.

1) Creation of CDFG;
2) Language-level optimization (loop merge, loop expansion, constant propagation, common-item extraction, dead-code deletion, function expansion, conversion to functional operator, array and structure implementation, pointer analysis, etc.);
3) Allocation (decision to set utilizable arithmetic units);
4) Resource-constraint scheduling (assign operation to cycle);
4') Loop pipelining (modulo scheduling+time constraint);
5) Binding (deciding arithmetic unit that executes operation of CDFG);
6) Interface generation of shared memory, etc.
7) Control logic generation;
8) Generation of logic-synthesizable RTL (Verilog-HDL, VHDL);

Modulo scheduling at 4') above is scheduling performed in accordance with the pipeline Data Initial Interval [DII: at what cycle intervals the data should be placed when the main body of the loop is pipelined (folded)]. (For example, if DII=3, the necessary numbers of arithmetic units are calculated at respective remainders 0, 1, 2, and scheduling is required that satisfies constraints, such as so arranging it that the arithmetic-unit constraint is satisfied, and scheduling the interval between write and read to be within the DII with regard to a feedback variable).

The details of the algorithm of resource-constraint scheduling at 4) above are indicated below. The procedure of the behavioral synthesis method utilizing condition vectors described above has been described in the form of an algorithm. Since this is a method that utilizes the properties of a generalized condition vector described thus far, it is referred to as a "Generalized Condition Vector-based List Scheduling Method".

With list scheduling, the basic processing is simple. Therefore, a plurality of constraints such as an arithmetic-device constraint and resource constraint are taken and it is easy to achieve algorithm extension to deal with an arithmetic chain, multi-cycle operation and various variations of operation nodes such as a pipeline arithmetic unit and pipeline memory.

Extensibility from the rear of such an algorithm is very important as far as a behavior synthesis system for practical use is concerned. Since the proposed system is utilized in designing commercial chips, it applies various extensions to a scheduling algorithm in order to realize utilization of clock-phase inversion, utilization of latches and application to plural clock domains.

Among these extensions, an algorithm that includes considerations of arithmetic chain, multi-cycle operation and multiplexer delay will be described below. What are adopted as operation nodes below are not only arithmetic operations such as addition but also all processing that is the object of scheduling, such as array access and input/output access. The term "arithmetic-unit constraint" also not only expresses the type of arithmetic unit, bit width and number of bits but also encompasses type of memory, number of ports (number of read ports and number of write ports) and number of input/output ports. It is an expression that signifies satisfying an arithmetic-unit constraint and also means satisfying the number of ports of the memory, etc.

This algorithm is a broad (global) scheduling algorithm. It is a method of scheduling multiple top conditional branch statements and a plurality of basic blocks at one time. Nevertheless, it is necessary to note that the algorithm does not have a portion that performs explicit handling relating to speculative execution of basic blocks or conditional branches, and appears substantially similar to arithmetic-unit-constraint-type list scheduling of a single basic block. (Since handling of delays and the division of nodes are described in the above-mentioned procedure, the description is complicated. However, the basic flow is similar to the list scheduling of a basic block.)

This indicates that by using condition vectors attached to the nodes of a CDFG, it is possible to conduct various searches that include speculative execution by a scheduling procedure that is oriented to a basic block (all types of out-of-order executions described above are possible). Various operations of GCV (calculation of necessary number of arithmetic units based upon FUV) only involve an amount of computation that is proportional to the number of branches of associated conditional statements. Therefore, this means that the scheduling method proposed by the present invention itself can be implemented with an amount of computation [n log(n)] substantially the same as that of list scheduling of a basic block. This is a more efficient amount of computation in comparison with a method of exponential order, such as the conventional path-based scheduling.

Although not touched upon above, the above-described algorithm has a function of performing scheduling that does not carry out speculative execution (local speculative execution) to a single branch. By handling a condition line to a fork node of a CDFG in the manner of data dependency, the implementation of this function is facilitated. Scheduling in a mode that does not perform speculative execution branch by each branch also is performed, and if it is advantageous in terms of number of registers, etc., without a change in necessary number of control steps, then this scheduling is adopted. Since speculative execution has such a property that a larger number of registers is utilized (since it holds also a variable that possibly may not be utilized), this strategy used in scheduling is that speculative execution to a single branch is performed twice for every branch. Parallelization of conditional statements is always carried out.

Figure 23:
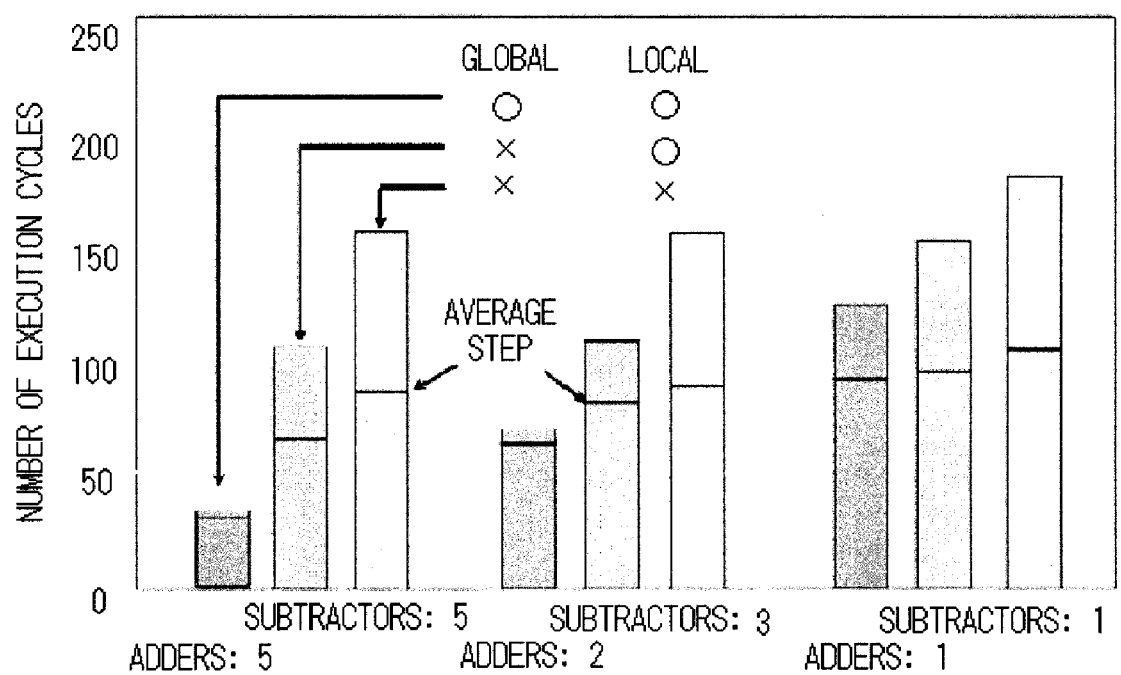
FIG. 23 is a diagram useful in describing the results of global and local out-of-order scheduling.

FIG. 23 illustrates the result of graphing 25 maha. FIG. 23 illustrates, in graphical form, maximum values of numbers of required steps and average steps with respect to "Both", "Local SP" and "In-order" methods when the arithmetic-unit constraints are increased as sets of adders and subtractors in the manner (1,1)→(2,3)→(5,5). This graph indicates that out-of-order scheduling proposed by the present invention acts ideally on the present data.

First, if viewed within the same number of arithmetic-unit constraints, it will be understood that the number of cycles is lowered greatly by applying local speculative execution and global parallelization in order from in-order. In particular, when the number of arithmetic units is large, this tendency becomes more conspicuous.

Next, a case where the arithmetic-unit constraint is increased to three stages will be considered. With in-order execution, the number of cycles does not decrease much (180→157→153) even if the total number of arithmetic units is increased to two, five and ten.

Next, with scheduling in which local speculative execution has been performed, if the number of arithmetic units is increased, the number of steps decreases greatly from two to five as the total number of arithmetic units in the manner 156 (2 arithmetic units)→107 (5 arithmetic units)→102 (10 arithmetic units) but does not decrease that much from five to ten arithmetic units. The reason for this is as follows: This is in accordance with the empirical rule often quoted in the case of processors, namely "even if a processor is made super-scalar, unless the compiler stands out, the degree of parallelism will not rise much even if the ALUs are increased to four or more". In a C description written by a user or programmer, conditional branches and loops, etc., appear every few lines and such a case wherein over several tens of lines continue in a basic block is very seldom.

Finally, if global out-of-order execution is performed, the necessary number of steps decreases in the manner 125→65→32 in a manner proportional to the increase in number of arithmetic units.

This is considered to indicate that if global out-of-order execution and local speculative execution proposed by the present invention are both performed, the impediment to parallelism by control dependency vanishes and parallelization is performed simply with data dependency.

That is, this indicates that the method of the present invention has a parallelization capability similar to that of a basic block even with respect to a complicated behavioral description comprising a number of basic blocks having a large number of conditional branches. Considered overall, operation that required 180 steps with the in-order method can be achieved in 32 steps by increasing the number of arithmetic units five-fold and applying the proposed parallelization method. This is approximately one-sixth the number of steps. Accordingly, it may be considered that parallelization is carried out substantially ideally.

Although the rate of decrease in number of steps appears lower than the rate of increase in number of arithmetic units, this is because it is a comparison with an example that does not use a parallelization technique. If the number of arithmetic units is increased five-fold between cases where a parallelization technique is utilized, the number of steps changes from 125 to 32. Therefore, the number of steps is reduced to one-fourth the original. This can be said to be a reasonable value.

Unlike a processor, for hardware synthesized by behavioral synthesis, high-speed capability is most important. Accordingly, the high level of parallelization performance of the proposed method is very important in order to achieve practical use.

FIG. 24 illustrates the result of scheduling of parallel conditional branches in branches of a GCV. "THIS INVENTION" is a method that utilizes a GCV, and "COMPARATIVE EXAMPLE" is a technique (in case of ACV only) in which mutual exclusiveness between parallel branch statements within such a branch cannot be seen precisely. In all three of these examples, the method of the present invention utilizing GCV could reduce the number of states in comparison with the prior art under the same number of arithmetic-unit constraints. (With these three designs, the number of states is equivalent to the number of execution steps.) This indicates that precise mutual exclusiveness of GCV is also effective in reducing the number of steps. Further, this indicates that predicted area and delay after behavioral synthesis are very near the area and delay of a circuit after logical synthesis of the behavior-synthesized RTL, and that error in the proposed prediction method of behavioral synthesis is small. In behavioral synthesis, optimization is applied based upon estimated area and delay. The accuracy of this is important.

It should be noted that the technique of the present invention and the technique of the comparative example apply synthesis with the same arithmetic-unit constraint with respect to these three designs, and therefore the number of arithmetic units used is the same. In the example of Filter, the area decreases more with the technique of the present invention. The reason is as follows: With the technique of the present invention, not just a scheduler but also a binding algorithm supports GCV, and mutual exclusiveness can be extracted more precisely. Although the fact that the number of registers and number of multiplexers are reduced can be mentioned, the present invention also affords a better improvement of the bind algorithm itself (especially optimization of the multiplexer) and the effect thereof is included. Area is not reduced solely by the effect of GCV. The overall program is improved by the present invention and the comparative example, and the effect such as optimization of the multiplexer could not be removed at the time of an experiment in the present invention.

FIG. 25 illustrates the results of testing effects in pipelining and a case where top-level conditional branch statements are parallelized (global parallelization). The example of design used is an example of small-scale description having two top-level IF statements within a loop of 100 iterations. Owing to global parallelization, execution of a loop body that required seven steps in the comparative example is performed in five steps, and overall execution latency is reduced 30% from 700 cycles to 500 cycles. Next, the result of pipelining (folding) the loop is illustrated. Here II is the abbreviation of Initial Interval and indicates the number of cycles of intervals in which the loop is iterated. Without global parallelization, synthesis can be performed only with II at 4. By contrast, when global parallelization is performed, scheduling is possible at II=2. It is possible for overall execution latency to be reduced 50% from 403 cycles to 203 cycles.

The causes that impede a reduction in II in a case where a loop is pipelined are dependency on the following:

1) resource contention; and
2) WAR (Write-After-Read).

Owing to global parallelization, degree of freedom of loop-body parallelism is increased and II can be minimized while overcoming the causes of the impediment.

It will be understood that the parallelization method that is based upon the condition vector proposed by the present invention increases effectiveness in case of loop pipelining in comparison with when ordinary synthesis is performed. With hardware design of signal processing such as image and voice processing, the pipeline circuit is very important. The global scheduling method proposed by the present invention plays an important role in automated synthesis of hardware from a behavioral description.

The concept of a condition vector that makes it possible to systematically implement global out-of-order execution and local out-of-order execution has been introduced, and a behavior synthesis method utilizing this concept and comprising a scheduling method CVLS, bind method and control logic generating method has been described. This method is characterized in that extraction of implicit conditional mutual exclusiveness, which can be discovered by data-dependency analysis, and analysis of number of arithmetic units in a case where various speculative executions are carried out can be performed efficiently, and in that all execution paths can be optimized.

A generalized condition vector is capable of systematically representing variations of out-of-order execution relating to conditional branches to the extent conceivable by the inventor. The condition vector is capable of representing conditional mutual exclusiveness and various speculative executions without changing the structure of the CDFG. Therefore it can be applied to various scheduling algorithms developed for scheduling methods for basic blocks. Various computations of condition vectors (mutual exclusiveness, calculation of necessary number of arithmetic units, generation of control logic, etc.) involve a small amount of computation (proportional to number of branches), and therefore global scheduling is made possible without reducing the computation efficiency of a (local) scheduling algorithm oriented toward a basic block. The results of tests indicate that a high-performance circuit can be synthesized by such parallelization.

Further, the CVLS method of resource constraint proposed by the present invention is capable being extended comparatively easily to a compiler intended for a processor having a number of ALUs, such as a VLIW or super-scalar processor.

More specifically, in a case where a resource constraint of registers and data transfer lines (buses) is introduced and the number of registers is inadequate, it will suffice to make a modification, such as introducing a spill code.

Figure 26:
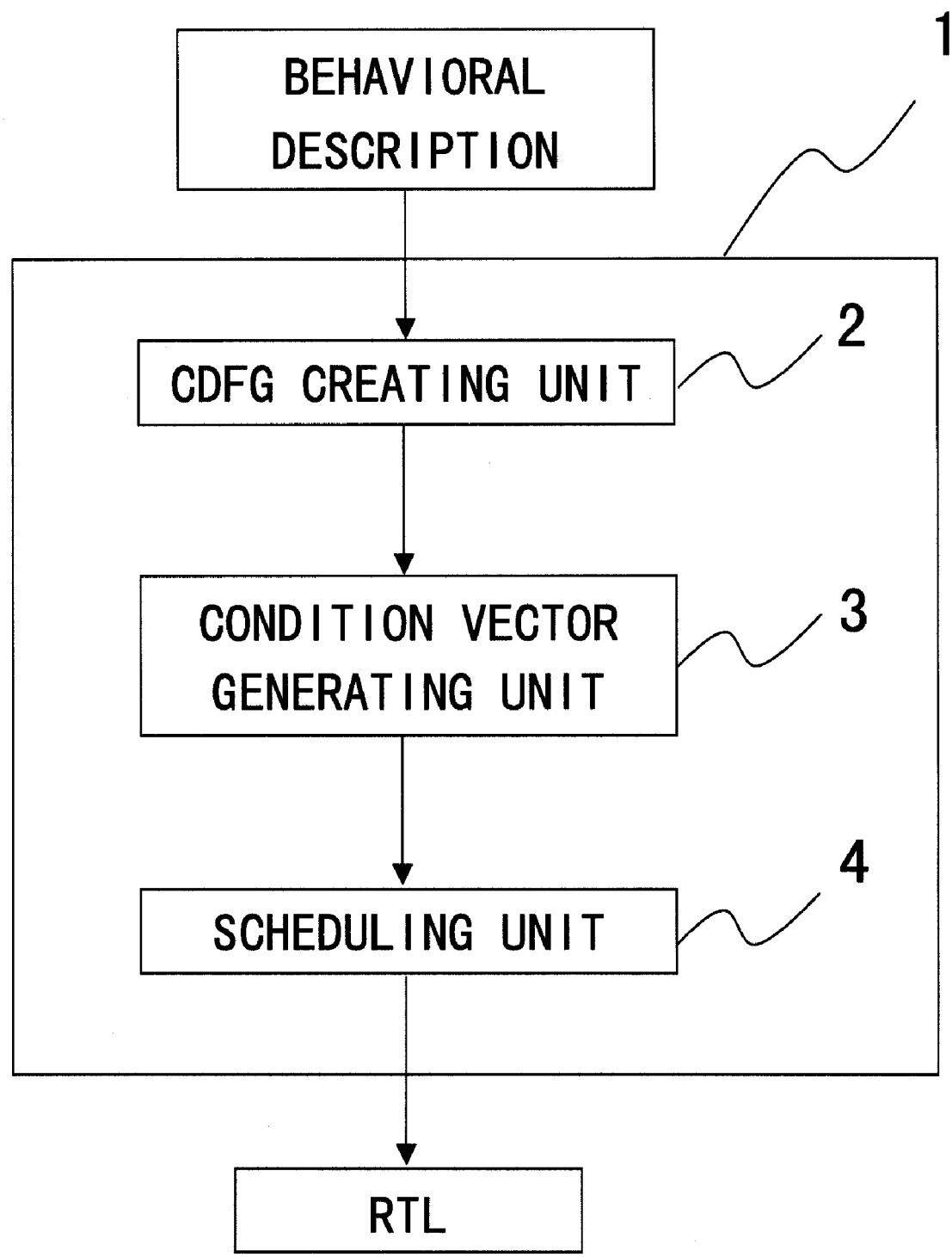
FIG. 26 is a diagram illustrating the configuration of an embodiment of the present invention.

FIG. 26 is a diagram useful in describing the principal components of an automated synthesis apparatus 1 according to an embodiment of the present invention. A control/data flow graph creating unit 2 analyzes a behavioral description (high-standard language such as C-language) input thereto and creates a control/data flow graph. A condition vector generating unit 3 generates the above-described GCV (or ECV, ACV, etc., besides the GCV) with respect to the control-data flow graph. A scheduling unit 4 performs the above-described global scheduling (inclusive of the above-described parallelization of a plurality of IF statements and synthesis of state transitions) using, e.g., GVC, in accordance with the above-described scheduling method. The scheduling unit 4 performs binding of data paths, generates a control circuit and generates logic-synthesizable RTL (Verilog-HDL, VHDL). Of course, it may be so arranged that these processes are implemented by a program executed by a computer that constitutes the automated synthesis apparatus. Further, with a compiler intended for a processor having a number of ALUs, such as a VLIW or super-scalar processor, instruction code intended for a processor having a number of ALUs, such as a VLIW or super-scalar processor, is generated instead of RTL.

Though the present invention has been described in accordance with the foregoing embodiment, the invention is not limited to this embodiment and it goes without saying that the invention covers various modifications and changes that would be obvious to those skilled in the art within the scope of the claims.

It should be noted that other objects, features and aspects of the present invention will become apparent in the entire disclosure and that modifications may be done without departing the gist and scope of the present invention as disclosed herein and claimed as appended herewith.

Also it should be noted that any combination of the disclosed and/or claimed elements, matters and/or items may fall under the modifications aforementioned.

What is claimed is:

1. An automated synthesis apparatus comprising:
a condition vector generating unit that creates a condition vector with respect to a node in a behavioral description; and
a scheduling unit;
wherein said condition vector generating unit generates a generalized condition vector (GCV) that includes valid bits which are set in consecutive components of a portion of the vector in a case where, with respect to one operation node in the behavioral description, an outer conditional operation to said one operation node is unresolved and an inner conditional operation to said one operation node is resolved, the valid bits being bits at positions where components of an extended condition vector (ECV) of the inner side resolved conditional operation are 1's; and
said scheduling unit performs scheduling, which includes processing for allocating an operation to a cycle, based upon the generalized condition vector (GCV) given to an operation node of a control/data flow graph corresponding to the behavioral description.

2. The apparatus according to claim 1, wherein said scheduling unit performs speculative execution of a conditional operation in a conditional branch and/or parallelization of multiple conditional statements.

3. The apparatus according to claim 1, wherein said condition vector generating unit obtains the generalized condition vector (GCV) by taking a bitwise logical OR between an extended condition vector (ECV) of one operation node in the behavioral description and an extended condition vector (ECV) of an outside unresolved conditional operation to which the one operation node belongs, the bitwise logical OR being performed with masking by components 1's of valid bits of the inside resolved condition.

4. The apparatus according to claim 3, wherein said condition vector generating unit allocates, to a leaf node of a conditional branch, a basic condition vector (BCV) of one-dimensional mutually independent code in which a number of dimensions is equal to the number of leaves and which has a 1 at only one component; a basic condition vector (BCV) of a parent node being calculated by a bitwise logical OR between basic condition vectors of child nodes; and obtains an extended condition vector (ECV), in which the number of dimensions is equal to the number of leaves, of a node immediately preceding a join node of the control/data flow graph, by a basic condition vector (BCV) of the node immediately preceding the join node, and an extended condition vector (ECV) of another operation node that is calculated by the bitwise logical OR between extended condition vectors (ECV) of succeeding operations of the data flow graph.

5. The apparatus according to claim 3, wherein when it is assumed that:

an extended condition vector (ECV) of one operation node in the behavioral description is an ECV (operation node);

an extended condition vector (ECV) of the outside unresolved conditional operation is an ECV (outside unresolved condition); and an extended condition vector (ECV) of the inner side resolved conditional operation is an ECV (inside resolved condition);

a generalized condition vector (GCV) of the one operation node is obtained by ECV (operation node)|{(~ECV (inside resolved condition)) & ECV (outside unresolved condition)} where ~, | and & denote a bit inversion operation, a bitwise logical OR and a bitwise logical AND, respectively.

6. The apparatus according to claim 3, wherein said condition vector generating unit, in obtaining the generalized condition vector (GCV) for a speculative execution of a conditional operation, initializes to 0 the components of a guard vector that performs masking in the bitwise logical OR, then repeats the following as loop processing from an inner conditional operation ci to an outside conditional operation:

substituting an extended condition vector ECV(n) of an operation node n into a generalized condition vector GCV(n) of an operation node;

in a case wherein a conditional operation ci (where ci is a condition, of an order higher than its own, of the conditional branch to which the node n belongs) is resolved, setting a valid bit with an extended condition vector ECV(ci) of the conditional operation ci serving as a guard vector; and in a case wherein the conditional operation ci is unresolved, adopting GCV(ni)|(~guard vector & ECV(ci)) as GCV(n), where ~, | and & denote a bit inversion operation, a bitwise logical OR and a bitwise logical AND, respectively.

7. The apparatus according to claim 3, wherein said scheduling unit, in obtaining an FUV (Function unit Utility condition Vector), which is a vector sum of condition vectors of all nodes allocated to a certain arithmetic unit, using a generalized condition vector (GCV), creates a set S of generalized condition vectors (GCV) of mutually overlapping valid bits;

collects all vectors having no valid bits into one set S0;

repeats the processing of the following { } with regard to each set S:

{for each GCV in the set S, repeating processing for adopting a result of vector addition of FUV(s) and GCV as FUV(s)};

performs ordinary vector addition of FUV of entire S and S0;

performs vector addition with components other than those of valid bits serving as 0; and after addition, sets the value of the largest component among the valid bits to other than a valid bit portion.

8. The apparatus according to claim 1, wherein said scheduling unit determines whether or not there is a possibility of sharing an arithmetic unit between operation nodes depending upon whether or not identical components of corresponding valid bits do not have a 1.

9. The apparatus according to claim 1, wherein said scheduling unit decides "mutually exclusive" between two nodes if identical bit positions between valid bits of the nodes do not have a 1, and decides "not mutually exclusive" if the identical bit positions have a 1.

10. The apparatus according to claim 1, wherein said scheduling unit in the decision of mutual exclusiveness of an operation in a generalized condition vector (GCV) regards components other than those of valid bits in the generalized condition vector as 0's.

11. The apparatus according to claim 1, wherein said scheduling unit checks mutual exclusiveness depending upon whether 1's do not overlap at identical positions when valid-bit positions do not overlap.

12. The apparatus according to claim 1, wherein said scheduling unit handles at least first and second conditional statements, which have been placed in parallel in a branch in the behavioral description, as a control structure identical with a control structure speculatively executed before the first and second conditional statements, in which the first and second conditional statements are placed in respective branches of a conditional in which the conditional operation is unresolved; parallel conditional statements inside a branch and speculative execution of a conditional being made able to be represented systematically by a generalized condition vector (GCV) having valid bits.

13. The apparatus according to claim 1, wherein said scheduling unit handles an operation belonging to a different top-level conditional branch as one having virtually unified generalized condition vectors (GCVs) with respect to multiple conditional branch statements arrayed in a top level in the behavioral description, handles the operation belonging to the different top-level conditional branch in a manner of an operation in one basic block at the time of scheduling, and schedules the operation node belonging to the different top-level conditional branch in any order.

14. The apparatus according to claim 1, wherein said scheduling unit performs global optimization across basic blocks in relation to speculative execution and/or path length utilizing a generalized condition vector (GCV) given to an operation node of the control/data flow graph.

15. The apparatus according to claim 1, wherein said scheduling unit utilizes the generalized condition vector (GCV) to perform scheduling freely, even between operations among multiple conditional branches, based upon a prescribed priority function relating to distance, and performs global speculative execution for parallelizing multiple conditional branches.

16. The apparatus according to claim 1, wherein said scheduling unit, in generating control logic in a case where conditional branches have been parallelized, obtains FUVall relating to a generalized condition vector (GCV) for every one in which valid bits overlap;

where FUVall is a vector sum of active condition vectors (ACV) of all operation nodes of a control/data flow graph scheduled to a certain control step, where the active condition vector ACV with respect to an operation node n is given by ECV(n) or ECV(Ci) or ECV(Cj) or .

... or ECV(Ck), where Ci, Cj, ... Ck are terminal nodes of conditionals of conditional branches to which the node n belongs and are unresolved in this control step of obtaining ACV; and generates a control circuit so as to skip 0 of the FUVall with respect to each of the conditional branches.

17. The apparatus according to claim 16, wherein said scheduling unit handles state transitions of nodes of generalized condition vectors (GCV) in which valid bits do not overlap as parallel conditional branch statements; and in order to combine a plurality of synchronous state transitions into one FSM (finite state machine), obtains a jump destination to which a jump is possible and the condition thereof in all branches of respective state transitions.

18. An automated synthesis method comprising:
creating a condition vector with respect to a node in a behavioral description; and
a scheduling operation; wherein said creating a condition vector includes:
generating a generalized condition vector (GCV) that includes valid bits that are set in consecutive components of the vector in a case where, with respect to one operation node in the behavioral description, an outer conditional operation to said one operation node is unresolved and an inner conditional operation to said one operation node is resolved, the valid bits at positions where components of an extended condition vector (ECV) of the inner side resolved conditional operation are 1's; and
said scheduling operation performs scheduling, which includes:
allocating an operation to a cycle, based upon a generalized condition vector (GCV) given to an operation node of a control/data flow graph corresponding to the behavioral description;
wherein the creating and the scheduling operation are performed using a computer.

19. The method according to claim 18, wherein said scheduling operation performs speculative execution of a conditional operation in a conditional branch and/or parallelization of multiple conditional statements.

20. The method according to claim 18, wherein said creating the condition vector obtains the generalized condition vector (GCV) by taking a bitwise logical OR between an extended condition vector (ECV) of one operation node in the behavioral description and an extended condition vector (ECV) of an outside unresolved conditional operation to which the one operation node belongs, the bitwise logical OR being performed with masking by components 1's of valid bits of the inside resolved condition.

21. The method according to claim 20, wherein a basic condition vector (BCV) of one-dimensional mutually independent code in which a number of dimensions is equal to the number of leaves and which has a 1 at only one component is allocated to a leaf node of a conditional branch;

a basic condition vector (BCV) of a parent node is calculated by a bitwise logical OR between basic condition vectors of child nodes; and
an extended condition vector (ECV), in which the number of dimensions is equal to the number of leaves, of a node immediately preceding a join node of the control/data flow graph is given by a basic condition vector (BCV) of the node immediately preceding the join node, and an extended condition vector (ECV) of another operation node is calculated by a bitwise logical ORed value between extended condition vectors (ECV) of succeeding operations of the data flow graph.

22. The method according to claim 20, wherein when it is assumed that:
an extended condition vector (ECV) of one operation node in the behavioral description is an ECV (operation node);
an extended condition vector (ECV) of the outside unresolved conditional operation is an ECV (outside unresolved condition); and
an extended condition vector (ECV) of the inner side resolved conditional operation is an ECV (inside resolved condition);
a generalized condition vector (GCV) of the one operation node is obtained by ECV (operation node)|{(~ECV (inside resolved condition)) & ECV (outside unresolved condition)}
where ~, | and & denote a bit inversion operation, a bitwise logical OR and a bitwise logical AND, respectively.

23. The method according to claim 18, wherein whether or not there is a possibility of sharing an arithmetic unit between operation nodes is determined depending upon whether or not identical components of corresponding valid bits do not have a 1.

24. The method according to claim 18, wherein mutual exclusiveness is decided if identical bit positions between valid bits of a node do not have a 1, and non mutual exclusiveness is decided if the identical bit positions have a 1.

25. The method according to claim 18, wherein in obtaining the generalized condition vector (GCV) for a speculative execution of a conditional operation, the method further comprising:
initializing to 0 the components of a guard vector that performs masking in the bitwise logical OR; and
repeating the following as loop processing from an inner conditional operation ci to an outside conditional operation:
substituting an extended condition vector ECV(n) of an operation node n into a generalized condition vector GCV(n) of an operation node;
in a case where a conditional operation ci (where ci is condition, of an order higher than its own, of the conditional branch to which the node n belongs) is resolved, setting a valid bit with an extended condition vector ECV(ci) of the conditional operation ci serving as a guard vector; and
in a case where the conditional operation ci is unresolved, adopting GCV(ni)|(~guard vector & ECV(ci)) as GCV (n),
where ~, | and & denote a bit inversion operation, a bitwise logical OR and a bitwise logical AND, respectively.

26. The method according to claim 18, wherein in obtaining an FUV (Function unit Utility condition Vector), which is a vector sum of condition vectors of all nodes allocated to a certain arithmetic unit, using a generalized condition vector (GCV), the method further comprising:
creating a set S of generalized condition vectors (GCV) of mutually overlapping valid bits; collecting all vectors having no valid bits into one set S0;
repeating the processing of the following { } with regard to each set S:
{for each GCV in the set S, repeating processing for adopting a result of vector addition of FUV(s) and GCV as FUV(s)};
performing ordinary vector addition of FUV of all S and S0;

performing vector addition with components other than those of valid bits serving as 0; and after addition, setting the value of the largest component among the valid bits to a value other than valid bit portion.

27. The method according to claim 18, wherein at least first and second conditional statements, which have been placed in parallel in a branch in the behavioral description, are handled as a control structure identical with a control structure speculatively executed before the first and second conditional statements, in which the first and second conditional statements are placed in respective branches of a conditional in which the conditional operation is unresolved;

parallel conditional statements inside a branch and speculative execution of a conditional being made able to be represented systematically by a generalized condition vector (GCV) having valid bits.

28. The method according to claim 18, further including handling an operation belonging to a different top-level conditional branch as one having virtually unified generalized condition vectors (GCV) with respect to multiple conditional branch statements arrayed in a top level in the behavioral description, handling the operation belonging to the different top-level conditional branch in a manner of an operation in one basic block at the time of scheduling, and scheduling the operation node belonging to the conditional branch of the different top level in any order.

29. The method according to claim 18, further including performing global optimization across basic blocks in relation to speculative execution and/or path length utilizing a generalized condition vector (GCV) given to an operation node of the control/data flow graph.

30. The method according to claim 18, further including utilizing the generalized condition vector (GCV) to perform scheduling freely, even between operations among multiple conditional branches, based upon a prescribed priority function relating to distance, and performing global speculative execution for parallelizing multiple conditional branches.

31. The method according to claim 18, wherein in generating control logic in a case where conditional branches have been parallelized, the method further comprising:

obtaining FUVall relating to a generalized condition vector (GCV) for every one in which valid bits overlap, where FUVall is a vector sum of active conditions vectors (ACV) of all operation nodes of a control/data flow graph scheduled to a certain control step, where the active condition vector ACV with respect to an operation node n is given by ECV(n) or ECV(Ci) or ECV(Cj) or . . . or ECV(Ck), where Ci, Cj, . . . Ck are terminal nodes of conditionals of conditional branches to which the node n belongs and are unresolved in this control step of obtaining ACV; and generating a control circuit so as to skip 0 of the FUVall with respect to each of the conditional branches.

32. The method according to claim 31, further including:

handling state transitions of nodes of generalized condition vectors (GCV) in which valid bits do not overlap as parallel conditional branch statements; and in order to merge a plurality of simultaneous state transitions into one FSM (finite state machine), obtaining a jump destination to which a jump is possible and the condition thereof in all branches of respective state transitions.

33. A non-transitory computer readable medium stored thereon a program, which when executed by a computer, causes the computer to execute, a method comprising:

processing for creating a condition vector with respect to a node in a behavioral description; wherein said processing for creating the condition vector generates a generalized condition vector (GCV) that includes valid bits that are set in consecutive components of a portion of the vector in a case where, with respect to one operation node in the behavioral description, an outer conditional operation to said one operation node is unresolved and an inner conditional operation to said one operation node is resolved, the valid bits being bits at positions where components of an extended condition vector (ECV) of the inner side resolved conditional operation are 1's; and scheduling processing for performing scheduling, which includes processing for allocating an operation to a cycle, based upon a generalized condition vector (GCV) given to an operation node of a control/data flow graph corresponding to the behavioral description.

34. The non-transitory computer readable medium according to claim 33, wherein said scheduling processing performs speculative execution of a conditional operation in a conditional branch and/or parallelization of multiple conditional statements.

35. The non-transitory computer readable medium according to claim 33, wherein said processing for creating the condition vector obtains the generalized condition vector (GCV) by taking a bitwise logical OR between an extended condition vector (ECV) of one operation node in the behavioral description and an extended condition vector (ECV) of an outside unresolved conditional operation to which the one operation node by components 1's of valid bits of the inside resolved condition.

36. The non-transitory computer readable medium according to claim 35, wherein a basic condition vector (BCV) of one-dimensional mutually independent code in which a number of dimensions is equal to the number of leaves and which has a 1 at only one component is allocated to a leaf node of a conditional branch;

a basic condition vector (BCV) of a parent node is calculated by a bitwise logical OR between basic condition vectors of child nodes; and an extended condition vector (ECV), in which the number of dimensions is equal to the number of leaves, of a node immediately preceding a join node of the control/data flow graph is given by a basic condition vector (BCV) of the node immediately preceding the join node, and an extended condition vector (ECV) of another operation node is calculated by a bitwise logical ORed value between extended condition vectors (ECV) of succeeding operations of the data flow graph.

37. The non-transitory computer readable medium according to claim 35, wherein when it is assumed that an extended condition vector (ECV) of one operation node in the behavioral description is an ECV (operation node), that an extended condition vector (ECV) of the outside unresolved conditional operation is an ECV (outside unresolved condition), and that an extended condition vector (ECV) of the inner side resolved conditional operation is an ECV (inside resolved condition), a generalized condition vector (GCV) of the one operation node is obtained by ECV (operation node)|{(~ECV (inside resolved condition)) & ECV (outside unresolved condition))

where ~, | and & denote a bit inversion operation, a bitwise logical OR and a bitwise logical AND, respectively.

38. The non-transitory computer readable medium according to claim 35, wherein in obtaining the generalized condition vector (GCV) for a speculative execution of a conditional operation, the program further includes:

processing for initializing to 0 the components of a guard vector that performs masking in the bitwise logical OR; and the following processing, which is repeated, from an inner conditional operation ci to an outside conditional operation:

substituting an extended condition vector ECV(n) of an operation node n into a generalized condition vector GCV(n) of an operation node;

in a case where a conditional operation ci, where ci is condition, of an order higher than its own, of the conditional branch to which the node n belongs, is resolved, setting a valid bit with an extended condition vector ECV(ci) of the conditional operation ci serving as a guard vector; and in a case where the conditional operation ci is unresolved, adopting GCV(ni)|(~guard vector & ECV(ci)) as GCV (n)

where ~, | and & denote a bit inversion operation, a bitwise logical OR and a bitwise logical AND, respectively.

39. The non-transitory computer readable medium according to claim 35, wherein in obtaining an FUV (Function unit Utility condition Vector), which is a vector sum of condition vectors of all nodes allocated to a certain arithmetic unit, using a generalized condition vector (GCV), the program further includes:

creating a set S of generalized condition vectors (GCV) of mutually overlapping valid bits; collecting all vectors having no valid bits into one set S0;

repeating the processing of the following { } with regard to each set S:

{for each GCV in the set S, repeating processing for adopting a result of vector addition of FUV(s) and GCV as FUV(s)};

performing ordinary vector addition of FUV of all S and S0; performing vector addition with components other than those of valid bits serving as 0; and after addition, setting the value of the largest component among the valid bits to a value other than valid bit portion.

40. The non-transitory computer readable medium according to claim 35, wherein at least first and second conditional statements, which have been placed in parallel in a branch in the behavioral description, are handled as a control structure identical with a control structure speculatively executed before the first and second conditional statements, in which the first and second conditional statements are placed in respective branches of a conditional in which the conditional operation is resolved;

parallel conditional statements inside a branch and speculative execution of a conditional being made able to be represented systematically by a generalized condition vector (GCV) having valid bits.

41. The non-transitory computer readable medium according to claim 35, wherein in generating control logic in a case where conditional branches have been parallelized, the computer program further includes:

obtaining FUVall relating to a generalized condition vector (GCV) for every one in which valid bits overlap, where FUVall is a vector sum of active conditions vectors (ACV) of all operation nodes of a control/data flow graph scheduled to a certain control step, where the active condition vector ACV with respect to an operation node n is given by ECV(n) or ECV(Ci) or ECV(Cj) or . . . or ECV(Ck), where Ci, Cj, . . . Ck are terminal nodes of conditionals of conditional branches to which the node n belongs and are unresolved in this control step of obtaining ACV; and generating a control circuit so as to skip 0 of the FUVall with respect to each of the conditional branches.

42. The non-transitory computer readable medium according to claim 41, further including handling state transitions of nodes of generalized condition vectors (GCV) in which valid bits do not overlap as a parallel conditional branch statement; and in order to merge a plurality of simultaneous state transitions into one FSM (finite state machine), obtaining a jump destination to which a jump is possible and the condition thereof in all branches of respective state transitions.

43. The non-transitory computer readable medium according to claim 33, further including handling an operation belonging to a different top-level conditional branch as one having virtually unified generalized condition vectors (GCVs) with respect to multiple conditional branch statements arrayed in a top level in the behavioral description, handling the operation belonging to the different top-level conditional branch in a manner of an operation in one basic block at the time of scheduling, and scheduling the operation node belonging to the different top-level conditional branch in any order.

44. The non-transitory computer readable medium according to claim 33, further including performing global optimization across basic blocks in relation to speculative execution and/or path length utilizing a generalized condition vector (GCV) given to an operation node of the control/data flow graph.

45. The non-transitory computer readable medium according to claim 33, further including utilizing the generalized condition vector (GCV) to perform scheduling freely, even between operations among multiple conditional branches, based upon a prescribed priority function relating to distance, and performing global speculative execution for parallelizing multiple conditional branches.

46. A compiler apparatus that inputs and analyzes source statements that include at least a behavioral description of processing, and generates codes for a processor capable of executing operations in parallel using multiple operation resources, said apparatus comprising:

a condition vector generating unit that creates a condition vector with respect to a node in a behavioral description; and a scheduling unit;

wherein said condition vector generating unit generates a generalized condition vector (GCV) that includes valid bits that are set in consecutive components of a portion of the vector in a case where, with respect to one operation node in the behavioral description, an outer conditional operation to said one operation node is unresolved and an inner conditional operation to said one operation node is resolved, the valid bits being bits at positions where components of an extended condition vector (ECV) of the inner side resolved conditional operation are 1's; and said scheduling unit performs scheduling, which includes processing for allocating an operation to a cycle, based upon a generalized condition vector (GCV) given to an operation node of a control/data flow graph corresponding to the behavioral description.

47. The apparatus according to claim 46, wherein said scheduling unit performs optimization that includes speculative execution of a conditional operation in a conditional branch and/or parallelization of multiple conditional statements.

48. The apparatus according to claim 46, wherein said condition vector generating unit obtains the generalized condition vector (GCV) by taking a bitwise logical OR between an extended condition vector (ECV) of one operation node in the behavioral description and an extended condition vector (ECV) of an outside unresolved conditional operation to which the one operation node belongs, the bitwise logical OR being performed with masking by components 1's of valid bits of the inside resolved condition.

49. The apparatus according to claim 48, wherein said condition vector generating unit allocates, to a leaf node of a conditional branch, a basic condition vector (BCV) of mutually one-dimensional independent code in which a number of dimensions is equal to the number of leaves and which has a 1 at only one component; a basic condition vector (BCV) of a parent node being calculated by a bitwise logical OR between basic condition vectors of child nodes; and obtains an extended condition vector (ECV), in which the number of dimensions is equal to the number of leaves, of a node immediately preceding a join node of the control/data flow graph is given by a basic condition vector (BCV) of the node immediately preceding the join node, and an extended condition vector (ECV) of another operation node is calculated by a bitwise logical ORed value between extended condition vectors (ECV) of succeeding operations of the data flow graph.

50. The apparatus according to claim 48, wherein when it is assumed that:

an extended condition vector (ECV) of one operation node in the behavioral description is an ECV (operation node);

an extended condition vector (ECV) of the outside unresolved conditional operation is an ECV (outside unresolved condition); and an extended condition vector (ECV) of the inner side resolved conditional operation is an ECV (inside resolved condition);

a generalized condition vector (GCV) of the one operation node is obtained by

ECV (operation node)|{(~ECV (inside resolved condition)) & ECV (outside unresolved condition))

where ~, | and & denote a bit inversion operation, a bitwise logical OR and a bitwise logical AND, respectively.

51. The apparatus according to claim 48, wherein said condition vector generating unit, in obtaining the generalized condition vector (GCV) at the time of speculative execution of a conditional operation, initializes to 0 the components of a guard vector that performs masking in the bitwise logical OR, then repeats the following as loop processing from an inner conditional operation ci to an outside conditional operation:

substituting an extended condition vector ECV(n) of an operation node n into a generalized condition vector GCV(n) of an operation node;

in a case where a conditional operation ci (where ci is a condition, of an order higher than its own of the conditional branch to which the node n belongs) is resolved, setting a valid bit with an extended condition vector ECV(ci) of the conditional operation ci serving as a guard vector; and in a case where the conditional operation ci is unresolved, adopting GCV(ni)|(~guard vector & ECV(ci)) as GCV(n)

where ~, | and & denote a bit inversion operation, a bitwise logical OR and a bitwise logical AND, respectively.

52. The apparatus according to claim 48, wherein said scheduling unit, in obtaining an FUV (Function unit Utility condition Vector), which is a vector sum of condition vectors of all nodes allocated to a certain arithmetic unit, using a generalized condition vector (GCV), creates a set S of generalized condition vectors (GCV) of mutually overlapping valid bits;

collects all vectors having no valid bits into one set S0;

repeats the processing of the following { } with regard to each set S:

{for each GCV in the set S, repeating processing for adopting a result of vector addition of FUV(s) and GCV as FUV(s)};

performs ordinary vector addition of FUV of all S and S0;

performs vector addition with components other than those of valid bits serving as 0; and after addition, sets the value of the largest component among the valid bits to other than a valid bit portion.

53. The apparatus according to claim 46, wherein said scheduling unit determines whether or not there is a possibility of sharing an arithmetic unit between operation nodes depending upon whether or not identical components of corresponding valid bits do not have a 1.

54. The apparatus according to claim 46, wherein said scheduling unit decides "mutually exclusive" between two nodes if identical bit positions between valid bits of the nodes do not have a 1, and decides "non mutually exclusive" if the identical bit positions have a 1.

55. The apparatus according to claim 46, wherein said scheduling unit is such that the determination of mutual exclusiveness of an operation in a generalized condition vector (GCV) regards components other than those of valid bits as 0's.

56. The apparatus according to claim 46, wherein said scheduling unit checks mutual exclusiveness depending upon whether 1's do not overlap at identical positions in a case where valid-bit positions do not overlap.

57. The apparatus according to claim 46, wherein said scheduling unit handles at least first and second conditional statements, which have been placed in parallel in a branch in the behavioral description, as a control structure identical with a control structure speculatively executed before the first and second conditional statements, in which the first and second conditional statements are placed in respective branches of a conditional in which the conditional operation is unresolved;

parallel conditional statements inside a branch and speculative execution of a conditional being made able to represented systematically by a generalized condition vector (GCV) having valid bits.

58. The apparatus according to claim 46, wherein said scheduling unit handles an operation belonging to a different top-level conditional branch as one having virtually unified generalized condition vectors (GCVs) with respect to multiple conditional branch statements arrayed in a top level in the behavioral description, handles the operation belonging to the different top-level conditional branch in a manner of an operation in one basic block at the time of scheduling, and schedules the operation node belonging to the different top-level conditional branch in any order.

59. The apparatus according to claim 46, wherein said scheduling unit performs global optimization across basic blocks in relation to speculative execution and/or path length utilizing a generalized condition vector (GCV) given to an operation node of the control/data flow graph.

60. The apparatus according to claim 46, wherein said scheduling unit utilizes the generalized condition vector (GCV) to perform scheduling freely, even between operations among multiple conditional branches, based upon a prescribed priority function relating to distance, and performs global speculative execution for parallelizing multiple conditional branches.

* * * * *